United States Patent
Iguchi

(10) Patent No.: US 9,793,287 B2
(45) Date of Patent: Oct. 17, 2017

(54) SEMICONDUCTOR WAFER WITH FIRST AND SECOND STACKED BODIES AND SEMICONDUCTOR MEMORY DEVICE

(71) Applicant: TOSHIBA MEMORY CORPORATION, Minato-ku (JP)

(72) Inventor: Tadashi Iguchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/069,158

(22) Filed: Mar. 14, 2016

(65) Prior Publication Data

US 2017/0077107 A1    Mar. 16, 2017

Related U.S. Application Data

(60) Provisional application No. 62/216,729, filed on Sep. 10, 2015.

(51) Int. Cl.
| | |
|---|---|
| *H01L 29/792* | (2006.01) |
| *H01L 27/11575* | (2017.01) |
| *H01L 27/11573* | (2017.01) |
| *H01L 27/11582* | (2017.01) |

(52) U.S. Cl.
CPC .. *H01L 27/11575* (2013.01); *H01L 27/11573* (2013.01); *H01L 27/11582* (2013.01)

(58) Field of Classification Search
CPC .......... H01L 27/11582; H01L 27/1157; H01L 21/28282; H01L 27/11556; H01L 27/11524

USPC ......................................................... 257/324
See application file for complete search history.

(56) References Cited

U.S. PATENT DOCUMENTS

| | | | |
|---|---|---|---|
| 2007/0252201 A1 | 11/2007 | Kito et al. | |
| 2011/0284947 A1 | 11/2011 | Kito et al. | |
| 2011/0287597 A1 | 11/2011 | Kito et al. | |
| 2011/0316069 A1* | 12/2011 | Tanaka .............. | H01L 27/11526 257/324 |
| 2014/0199815 A1* | 7/2014 | Hwang ............. | H01L 29/66833 438/270 |
| 2015/0287739 A1* | 10/2015 | Lee ................... | H01L 27/11575 257/326 |
| 2015/0372006 A1 | 12/2015 | Kito et al. | |
| 2016/0268298 A1 | 9/2016 | Iguchi et al. | |

FOREIGN PATENT DOCUMENTS

JP    2007-266143 A    10/2007

* cited by examiner

*Primary Examiner* — Andy Huynh
(74) *Attorney, Agent, or Firm* — Oblon, McClelland, Maier & Neustadt, L.L.P.

(57) ABSTRACT

A semiconductor wafer including first and second stacked bodies provided on separate parts of a substrate. The first stacked body includes a first insulating and a second insulating film being provided on the first portion, the second stacked body includes a plurality of third insulating films and a plurality of electrode films. The third insulating films and the electrode films are alternately stacked, and a shape of an end portion of the second stacked body on a side opposing to the first stacked body is a stepped pattern.

8 Claims, 17 Drawing Sheets

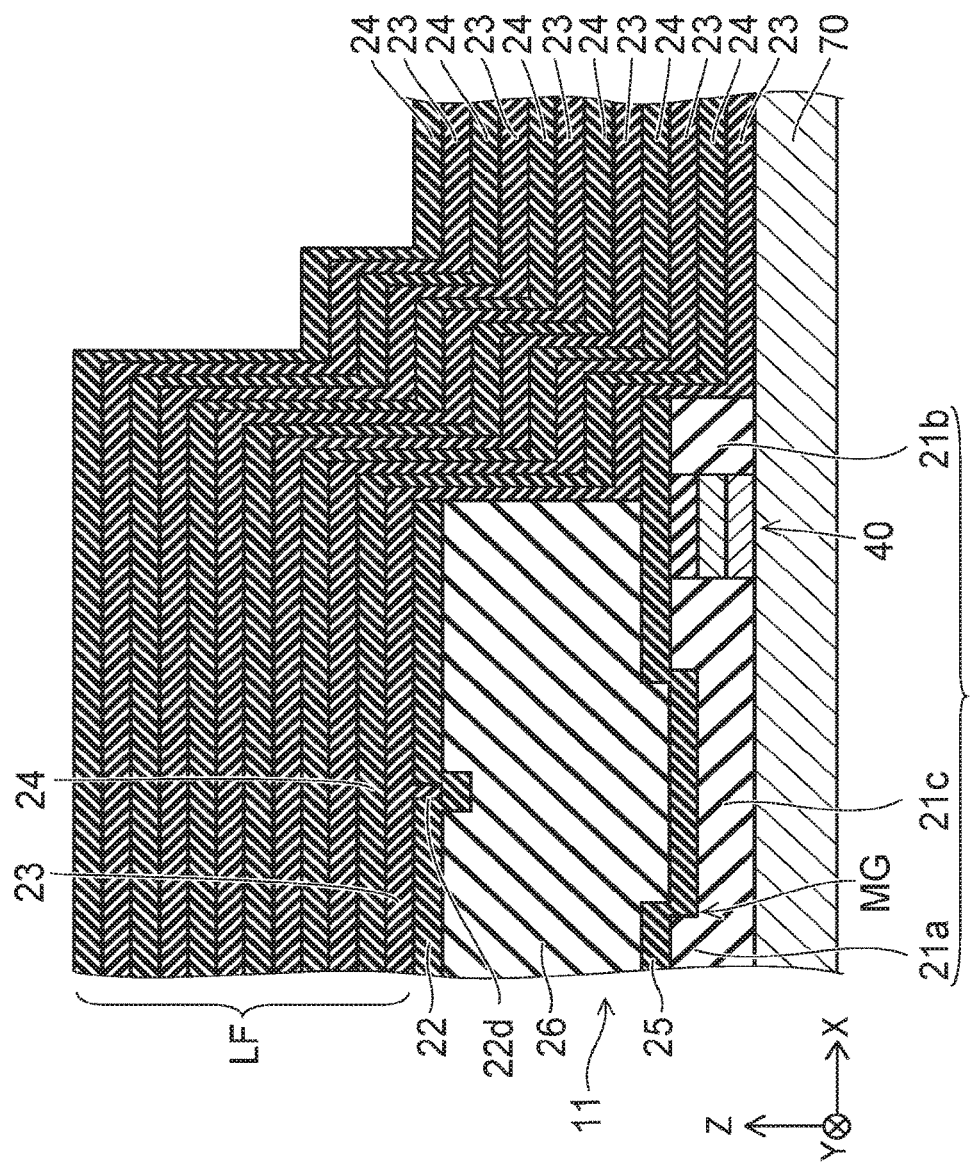

SEMICONDUCTOR WAFER WITH FIRST AND SECOND STACKED BODIES AND SEMICONDUCTOR MEMORY DEVICE

CROSS-REFERENCE TO RELATED APPLICATIONS

Reference is hereby made to U.S. patent application Ser. No. 13/112,345, filed on May 20, 2011, the entire disclosure of which is incorporated herein by reference.

This application is based upon and claims the benefit of priority from U.S. Provisional Patent Application 62/216,729 filed on Sep. 10, 2015; the entire contents of which are incorporated herein by reference.

FIELD

Embodiments described herein relate generally to a method for manufacturing semiconductor memory device, a semiconductor wafer and a semiconductor memory device.

BACKGROUND

There is a stacked semiconductor memory device including memory cells that are three-dimensionally disposed for increasing the degree of integration of memory. The semiconductor memory device includes a plurality of semiconductor pillars extending in a stacked direction and a plurality of electrode films (word lines) that extend in a direction intersecting the staked direction and are arranged in the stacked direction. A memory cell is formed between the semiconductor pillar and the electrode film. In a method for manufacturing such a semiconductor memory device, it is desired to be able to reduce a chip size.

BRIEF DESCRIPTION OF THE DRAWINGS

FIG. 5 is a schematic cross sectional view in the order of steps illustrating the semiconductor memory device manufacturing method according to the first embodiment;

DETAILED DESCRIPTION

Figure 1A:
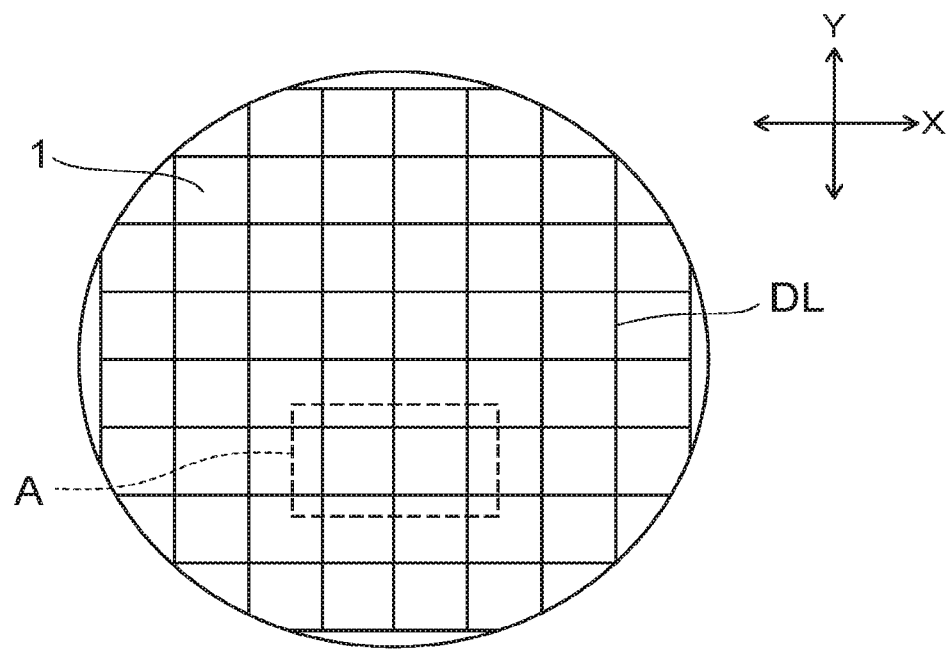
FIG. 1A is a schematic view illustrating a semiconductor wafer according to a first embodiment.

According to one embodiment, a method for manufacturing a semiconductor memory device includes forming a first insulating film on a substrate. The method includes forming a first portion, a second portion, and a third portion in the first insulating film by etching a part of the first insulating film. The second portion is arranged with the first portion in a first direction. The third portion is formed between the first portion and the second portion. A thickness of the third portion is thinner than a thickness of each of the first portion and the second portion. The method includes forming a second insulating film on the first insulating film. The method includes removing a part of the second portion, a portion including a region directly above the part of the second portion of the second insulating film, and at least a part of a portion including a region directly above another part of the second portion of the second insulating film, exposing at least a part of the other part of the second portion and a part of the substrate, and forming a first stacked body. The method includes stacking third insulating films and fourth insulating films alternately on the first stacked body and on a part of the substrate, and forming a stacked film including a plurality of the third insulating films and a plurality of the fourth insulating films. The method includes exposing the first stacked body by removing a part of the stacked film, and forming a stacked structure by processing an end portion of a remaining part of the stacked film on a side opposing to the first stacked body into a stepped pattern forming steps for each of the third insulating films. A depression is formed on the region directly above the third portion in an upper surface of the second insulating film.

Hereinafter, embodiments of the invention will be described with reference to the drawings.

The drawings are schematic or conceptual, and the relationships between the thicknesses and widths of portions, the proportions of sizes between portions, etc., are not necessarily the same as the actual values thereof. Further, the dimensions and/or the proportions may be illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

Figure 1B:
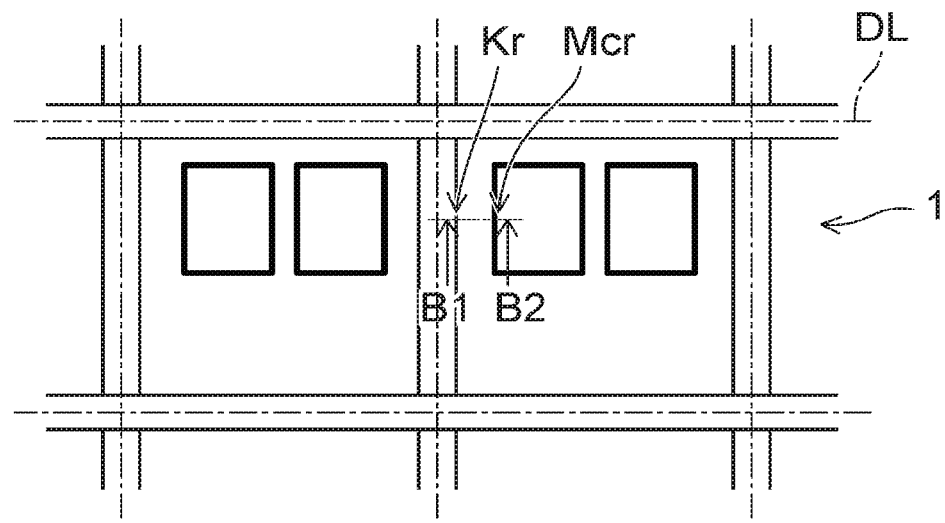
FIG. 1B is a schematic view illustrating the semiconductor wafer according to the first embodiment.
Figure 2:
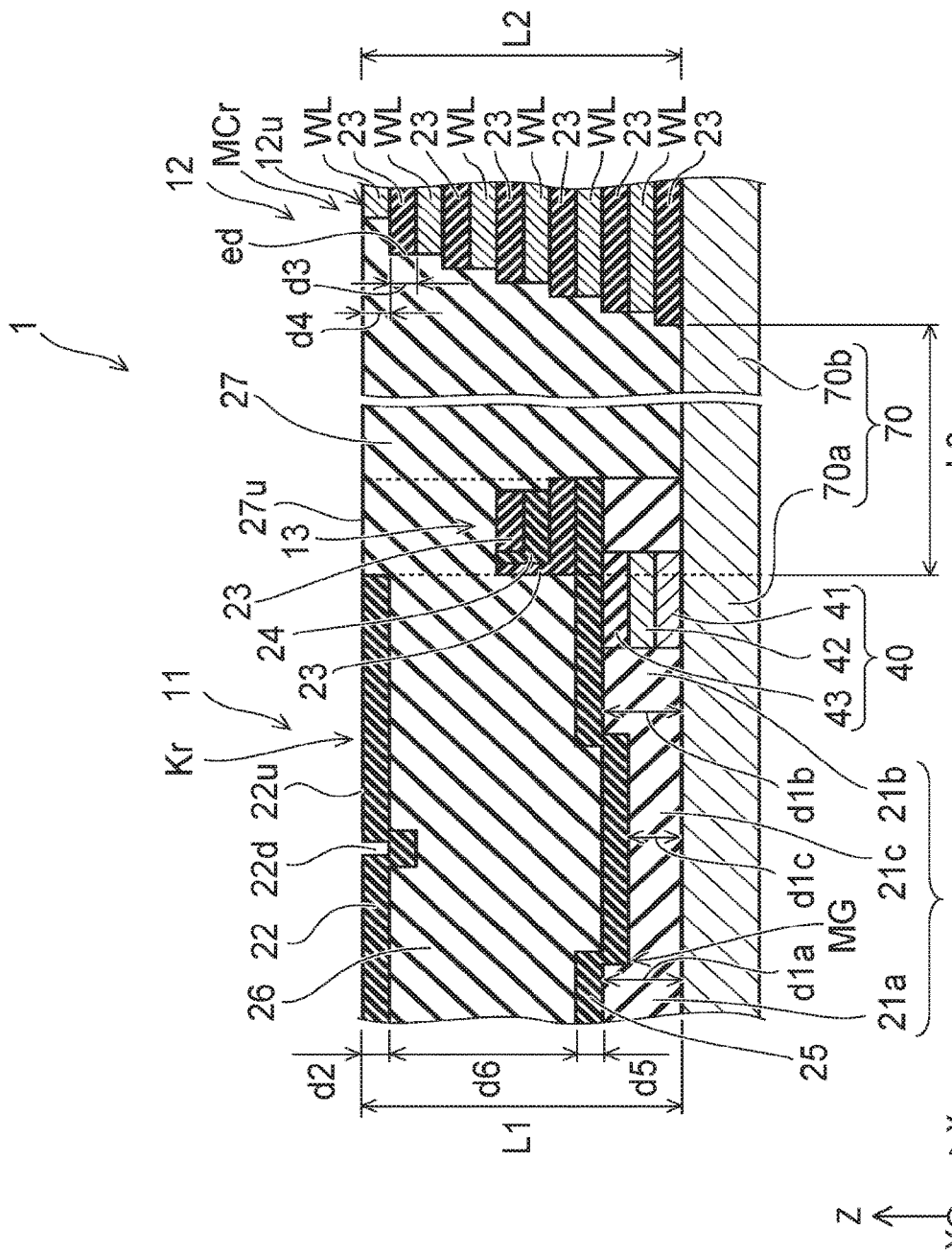
FIG. 2 is a schematic view illustrating the semiconductor wafer according to the first embodiment.

FIGS. 1A, 1B, and FIG. 2 are schematic views illustrating a semiconductor wafer according to a first embodiment.

FIG. 1A is a schematic plan view illustrating a whole of the semiconductor wafer.

FIG. 1B is a schematic enlarged view magnifying portion A of FIG. 1A.

In a semiconductor wafer 1, large numbers of three-dimensionally stacked semiconductor memory devices are formed. Accordingly, the semiconductor wafer 1 is divided into large numbers of three-dimensionally stacked semiconductor memory devices by dicing along the dicing lines DL shown in FIGS. 1A and 1B.

The dicing lines DL are regions that are diced. The kerf region Kr is a region around the dicing lines DL. The memory cell region MCr is a region where the memory cells of the semiconductor memory device are formed.

The kerf region (dicing line, scribe line) Kr includes a lithography mark, or a mark for film thickness measurement. The kerf region Kr is a region that is cut by a dicing blade, for example, when the semiconductor wafer 1 is divided into semiconductor chips of the semiconductor memory device. A whole region of the kerf region Kr is not necessarily cut, a part of the kerf region Kr is cut in some cases. That is, a part of the kerf region Kr may remain at a periphery of the semiconductor memory devices after being divided semiconductor wafer 1 into the semiconductor memory devices.

FIG. 2 is a schematic cross sectional view illustrating a cross section at B1-B2 of FIG. 1B.

The semiconductor wafer 1 according to the embodiment includes a substrate 70, a first stacked body 11, and a second stacked body 12.

In FIG. 2, X-direction and Y-direction are directions that are perpendicular to each other, and parallel to the major surface of the substrate 70. Z-direction (stacked direction) is a direction perpendicular to both X-direction and Y-direction. A first direction is, for example, X-direction. A second direction is, for example, Y-direction. A third direction is, for example, Z-direction.

The first stacked body 11 corresponds to the stacked structure of the kerf region Kr of the semiconductor wafer 1.

The second stacked body 12 corresponds to the stacked structure of the memory cell region MCr of the semiconductor wafer 1 (semiconductor memory device).

The first stacked body 11 is provided in the kerf region Kr. The first stacked body 11 is provided on a part 70a of the substrate 70. That is, the substrate 70 in the kerf region Kr is defined as the part 70a of the substrate 70. The second stacked body 12 is provided in the memory cell region MCr. The second stacked body 12 is provided on another part 70b of the substrate 70. That is, the substrate 70 in the memory cell region MCr is defined as another part 70b of the substrate 70. The second stacked body 12 is provided separately from the first stacked body 11 in X-direction.

The first stacked body 11 includes a first insulating film 21, a second insulating film 22, a fifth insulating film 25 and a sixth insulating film 26. The first insulating film 21 is provided on the part 70a of the substrate 70. As the first insulating film 21, silicon oxide, for example, is used. As the second insulating film 22, silicon nitride, for example, is used. As the fifth insulating film 25, silicon nitride, for example, is used. As the sixth insulating film 26, silicon oxide, for example, is used.

The first insulating film 21 includes a first portion 21a, a second portion 21b and a third portion 21c. The second portion 21b is arranged with the first portion 21a in X-direction. The third portion 21c is provided between the first portion 21a and the second portion 21b.

A thickness d1a of the first portion 21a is thicker than a thickness d1c of the third portion 21c. A thickness d1b of the second portion 21b is thicker than the thickness d1c of the third portion 21c. The first portion 21a, the second portion 21b and the third portion 21c form a depression MG. A height of the depression MG is lower than a height of surrounding the depression MG. The depression MG refers to the whole region that a height is lower than the height of the surrounding.

The second insulating film 22 is provided on the first portion 21a, the third portion 21c, and at least a part of the second portion 21b. A thickness d2 of the second insulating film 22 is thinner than the thickness d1c of the third portion 21c. The second insulating film 22 includes an upper surface 22u. The upper surface 22u has a depression 22d that overlaps the third portion 21c when projected onto a plane that includes X-direction and Y-direction. The depression 22d is the result of the transfer of the depression MG through the fifth insulating film 25 and the sixth insulating film 26. The depression 22d functions as a mark that indicates the location of the depression MG. The mark is used for, for example, alignment in the lithography process. The depression 22d refers to the whole region that a height is lower than the height of the surrounding.

The fifth insulating film 25 is provided between the first insulating film 21 and the second insulating film 22. The fifth insulating film 25 overlaps the first insulating film 21. A thickness d5 of the fifth insulating film 25 is thinner than the thickness d1c of the third portion 21c. The fifth insulating film 25 has a depression that reflects the depression MG.

The sixth insulating film 26 is provided between the fifth insulating film 25 and the second insulating film 22. A thickness d6 of the sixth insulating film 26 is thicker than the thickness d1c of the third portion 21c. The sixth insulating film 26 has a depression that reflects the depression MG, same as the fifth insulating film 25.

The second stacked body 12 includes a plurality of third insulating films 23 and a plurality of electrode films WL. The third insulating films 23 and the electrode films WL are alternately stacked. The number of layers of the third insulating film 23 and the number of layers of the electrode film WL are merely examples, and the number of layers is not limited to that shown in the FIG. 2. A shape of an end portion of the second stacked body 12 on a side opposing to the first stacked body is a stepped pattern. That is, a lower surface of an end portion ed of the third insulating film 23 is covered with the electrode film WL located under the third insulating film 23. An upper surface of the end portion ed of the third insulating film 23 is not covered with another electrode film WL located on the third insulating film 23. A position in X-direction of a side surface of the electrode film WL located under the third insulating film 23 is different from a position in X-direction of a side surface of another electrode film WL located on the third insulating film 23.

A position of the upper surface 12u of the second stacked body 12 and a position of the upper surface 22u of the second insulating film 22 (the upper surface of the first stacked body 11) are substantially at the same height. That is, the length L1 of the first stacked body 11 along Z-direction and the length L2 of the second stacked body 12 along Z-direction are substantially the same. It is desirable that the depression 22d of the second insulating film 22 is substantially at the same height as the second stacked body 12 in Z-direction. A silicon oxide film or a silicon nitride film may be provided on the second stacked body 12. In this case, the upper surface of the silicon oxide film or the upper surface of the silicon nitride film may be substantially at the same height as the upper surface 22u of the second insulating film 22 (the upper surface of the first stacked body 11).

The first insulating film 21 includes, for example, silicon oxide. The thickness d1a of the first portion 21a is, for example, not less than 300 nanometers (nm) and not more than 700 nm. The thickness d1b of the second portion 21b is, for example, not less than 300 nm and not more than 700 nm. The thickness d1c of the third portion 21c is, for example, not less than 200 nm and not more than 600 nm. The second insulating film 22 includes, for example, silicon nitride. The thickness d2 of the second insulating film 22 is, for example, not less than 100 nm and not more than 300 nm. The fifth insulating film 25 includes, for example, silicon nitride. The thickness d5 of the fifth insulating film 25 is, for example, not less than 50 nm and not more than 300 nm. The sixth insulating film 26 includes, for example, silicon oxide. The thickness d6 of the sixth insulating film 26 is, for example, not less than 1000 nm and not more than 10000 nm.

The third insulating film 23 includes, for example, silicon oxide. The thickness d3 of the third insulating film 23 is, for example, not less than 10 nm and not more than 100 nm. As the material of the electrode film WL, a metal such as tungsten, for example, is used. The thickness d4 of the electrode film WL is, for example, not less than 10 nm and not more than 100 nm.

The semiconductor wafer 1 further includes a first member 40. The first member 40 is provided between the substrate 70 and the fifth insulating film 25. The second portion 21b is provided between the third portion 21c and the first member 40. The first member 40 is positioned near the dicing lines, and functions as a crack preventing member that prevents cracking during the dicing process. The first member 40 has, for example, the same structure as a gate electrode of a CMOS (Complementary Metal Oxide Semiconductor) used for peripheral circuits. The first member 40 includes a silicon film 41 provided on the substrate 70, a metal film 42 provided on the silicon film 41, and a silicon nitride film 43 provided on the metal film 42. As the material of the silicon film 41, polysilicon, for example, is used. As the material of the metal film 42, tungsten (W), for example, is used.

The semiconductor wafer 1 further includes a third stacked body 13. The third stacked body 13 is provided between the first stacked body 11 and the second stacked body 12. A position of the third stacked body 13 is higher than a position of the fifth insulating film 25, and is lower than a position of the upper surface 12u of the second stacked body 12. In the third stacked body 13, the third insulating films 23 and the fourth insulating films 24 are alternately stacked. The fourth insulating film 24 includes, for example, silicon nitride. The number of layers of the third stacked body 13 is fewer than the number of layers of the second stacked body 12. The third insulating film 23 and the fourth insulating film 24 located in a lower layer side are bent upward at an end portion of the third stacked body 13 on a side of the first stacked body 11. The third stacked body 13 remains in the semiconductor memory devices separated from the semiconductor wafer 1.

The semiconductor wafer 1 further includes a seventh insulating film 27. The seventh insulating film 27 is formed using the same material used for the sixth insulating film 26. The seventh insulating film 27 is provided between the first stacked body 11, the second stacked body 12, and the third stacked body 13. The seventh insulating film 27 includes, for example, silicon oxide. A position of an upper surface 27u of the seventh insulating film 27 and a position of the upper surface 22u of the second insulating film 22 (the upper surface of the first stacked body 11) are substantially at the same height. The seventh insulating film 27 and the sixth insulating film 26 are different films, though the seventh insulating film 27 and the sixth insulating film 26 are shown as being integrally in FIG. 2.

A distance between an end portion of the second insulating film 22 on a side of the second stacked body 12 (an end portion of the first stacked body 11) and an end portion of a lower layer side of the second stacked body 12 along X-direction is L3. The distance L3 is, for example, not less than 10 micrometers (μm) and not more than 100 μm.

In the semiconductor wafer 1 of the embodiment, the depression MG of the first insulating film 21 is transferred in Z-direction, and the depression 22d is formed in the upper surface 22u of the second insulating film 22. The depression MG is below less than several micrometers, and cannot be easily detected with accuracy. On the other hand, the depression 22d is detectable from above the semiconductor wafer 1. The depression 22d functions as, for example, an alignment mark in the lithography process.

In the semiconductor wafer 1 of the embodiment, the depression MG of the first insulating film 21 is transferred in Z-direction through the fifth insulating film 25 and the sixth insulating film 26, and the depression 22d is formed in the upper surface 22u of the second insulating film 22. That is, the first stacked body 11 on the kerf region side does not have the same stepped structure as that provided in the second stacked body 12. This makes it possible to reduce the distance L3. That is, the boundary region between the kerf region and the memory cell region can have smaller dimensions. This enables reducing the chip size.

Figure 3A:
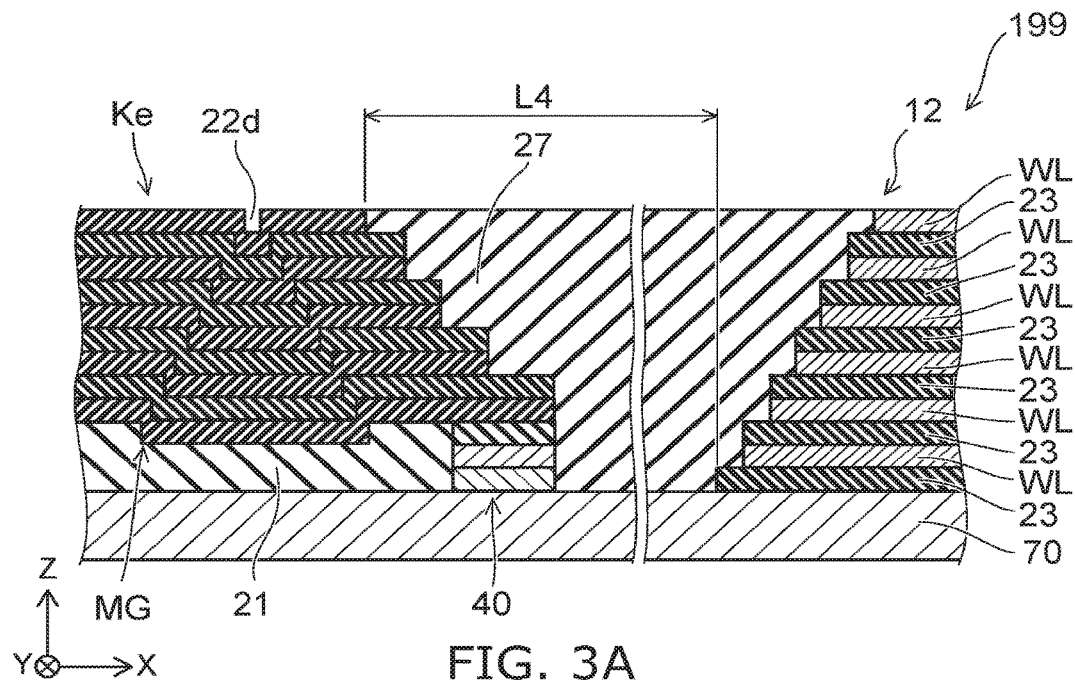
FIG. 3A is a schematic cross sectional view illustrating the semiconductor wafer according to a reference example.
Figure 3B:
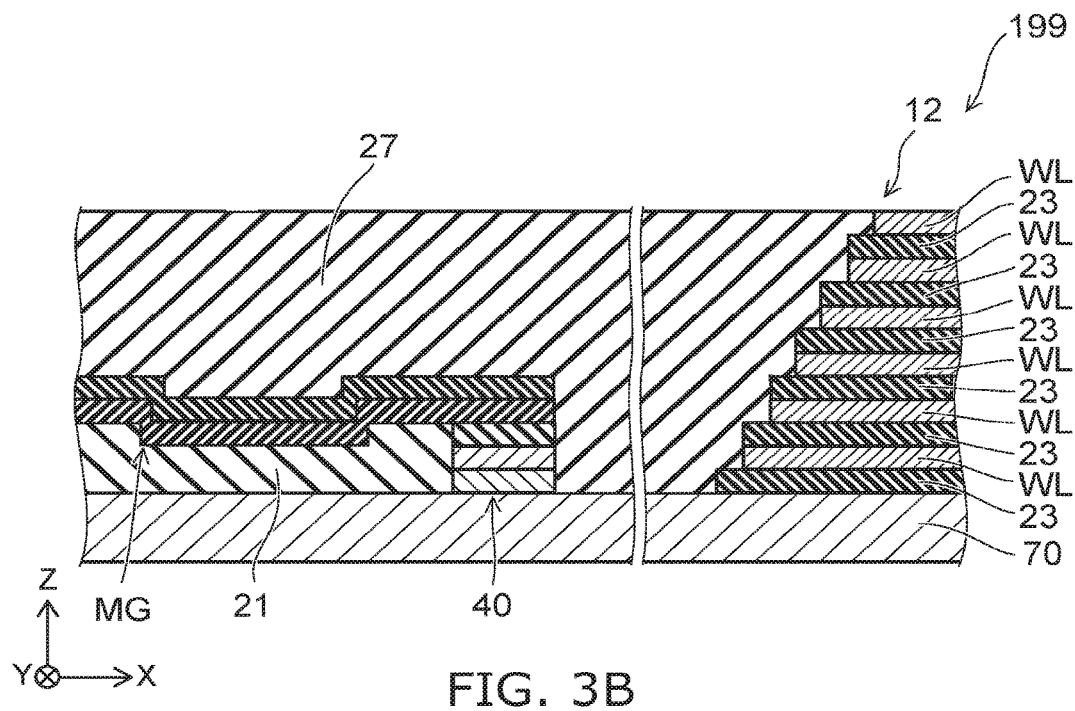
FIG. 3B is a schematic cross sectional view illustrating the semiconductor wafer according to the reference example.

The following specifically describes the effects of the embodiment in comparison with reference examples depicted in FIGS. 3A and 3B.

FIGS. 3A and 3B are schematic cross sectional views illustrating semiconductor wafers according to reference examples.

FIGS. 3A and 3B represent different reference examples.

As shown in FIG. 3A, a semiconductor wafer 199 according to the reference example includes a stacked body Ke and a second stacked body 12. The stacked body Ke corresponds to the stacked structure of the kerf region of the semiconductor wafer 199. The second stacked body 12 corresponds to the stacked structure of the memory cell region of the semiconductor wafer 199. In contrast to the first stacked body 11 of the embodiment that does not have the stepped structure, the stepped structure is present in the stacked body Ke of the reference example. Thus, a distance between the stacked bodies in the structure of the embodiment is able to be shorter than a distance between the stacked bodies in the structure of the reference example.

The stacked body Ke includes a plurality of third insulating films 23 and a plurality of electrode films WL. The third insulating films 23 and the electrode films WL are alternately stacked in the stacked body Ke. In the stacked body Ke, the third insulating film 23 and the electrode film WL form a stepped end portion. An upper surface of the stacked body Ke has a depression 22d. The depression 22d is the result of the transfer of the depression MG of the first insulating film 21 through the plurality of insulating films. A seventh insulating film 27 is embedded between the stacked body Ke and the second stacked body 12.

That is, if the stacked body Ke were used in place of the first stacked body 11, the stepped structure would also be formed in the stacked structure on the kerf region side. Such a stepped structure is not desirable as it increases the chip size. The distance between the end portion of the stacked body Ke on the side of the second stacked body 12 (the end portion of the top layer) and the end portion of the lower layer side of the second stacked body 12 along X-direction is L4. The distance L4 is as long as 200 to 300 μm, taking into account the margin for process dimensions. The region over distance L4 is a structurally unused and unnecessary region.

It might be possible to remove the stepped structure on the kerf region side as shown in FIG. 3B. However, removing the stepped structure also removes the depression 22d corresponding to the depression MG, and makes it difficult to align. That is, in contrast to the embodiment in which the depression 22d is transferred, depression 22d in the reference example of FIG. 3B is not transferred. Thus, it is difficult to align in the structure of the reference example shown in FIG. 3B.

As shown in FIG. 2, in the semiconductor wafer 1 according to the embodiment, the depression MG of the first insulating film 21 is transferred in Z-direction through the fifth insulating film 25 and the sixth insulating film 26, and the depression 22d is formed in the upper surface 22u of the second insulating film 22. Unlike the reference example of FIG. 3A, the first stacked body 11 on the side of the kerf region does not have the stepped structure. Unlike the reference example of FIG. 3B, the depression 22d is formed in the upper surface of the first stacked body 11.

That is, in the embodiment, the distance L3 between the first stacked body 11 and the second stacked body 12 can be made shorter while maintaining the depression 22d corresponding to the depression MG.

Specifically, in contrast to distance L4 of the reference example that is several hundred micrometers, the distance L3 of the embodiment is, for example, not less than 10 μm and not more than 100 μm. By eliminating the stepped structure, the boundary region between the kerf region and the memory cell region can have smaller dimensions. This makes it possible to reduce the chip size.

It is also advantageous in terms of planarizing the upper surface 27u of the seventh insulating film 27 to make distance L3 shorter. It is difficult to evenly planarize a surface over a length on the order of several hundred micrometers. In the embodiment, the upper surface 27u of the seventh insulating film 27 can be evenly planarized because distance L3 can have a length on the order of several ten micrometers.

(Manufacturing Method of First Embodiment)

FIGS. 4A and 4B, FIG. 5, FIG. 6, FIG. 7, and FIG. 8 are schematic cross sectional views illustrating a semiconductor memory device manufacturing method in the order of steps according to the first embodiment.

Figure 9A:
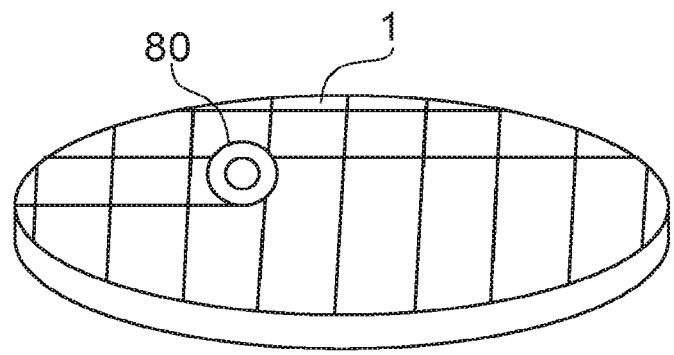
FIG. 9A is a schematic view in the order of steps illustrating the semiconductor memory device manufacturing method according to the first embodiment.
Figure 9B:
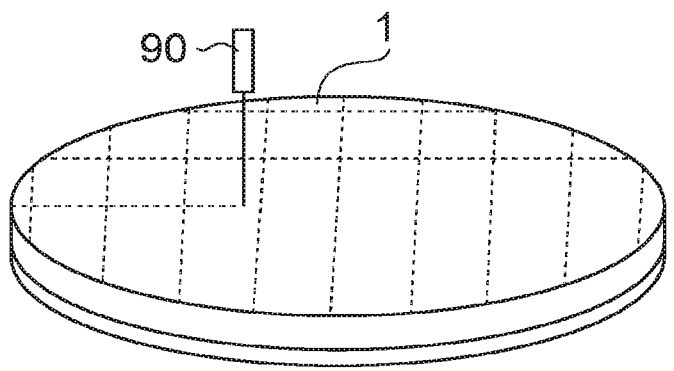
FIG. 9B is a schematic view in the order of steps illustrating the semiconductor memory device manufacturing method according to the first embodiment.

FIGS. 9A and 9B are schematic views illustrating the semiconductor memory device manufacturing method in the order of steps according to the first embodiment.

The embodiment is a method for manufacturing a semiconductor memory device that uses the semiconductor wafer 1 according to the first embodiment.

Figure 4A:
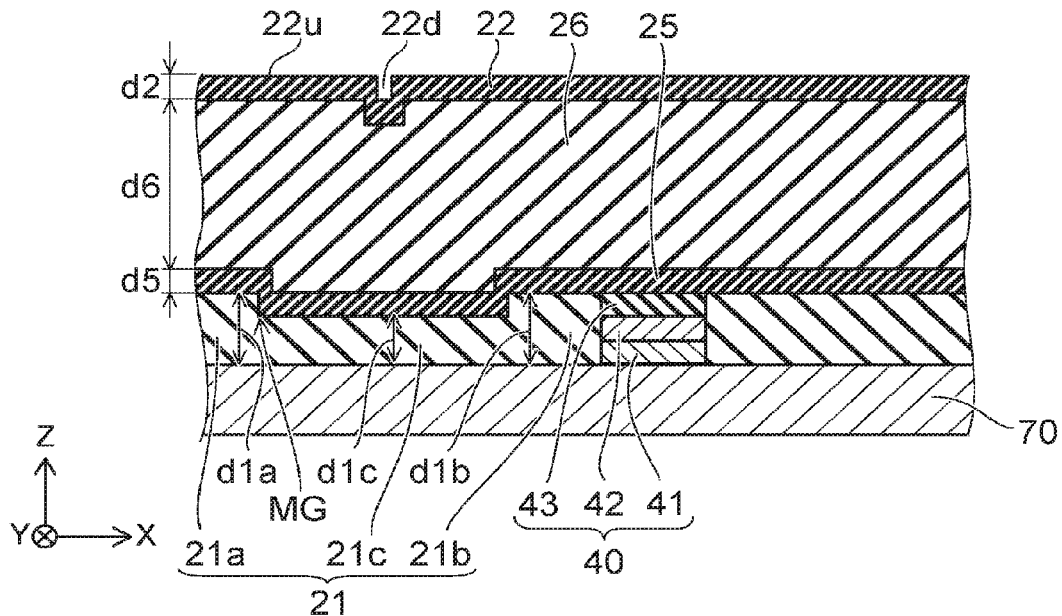
FIG. 4A is a schematic cross sectional view in the order of steps illustrating the semiconductor memory device manufacturing method according to the first embodiment.

As shown in FIG. 4A, the first member 40 is formed on a part of the substrate 70. Specifically, the silicon film 41 is formed on the substrate 70, the metal film 42 is formed on the silicon film 41, and the silicon nitride film 43 is formed on the metal film 42. The first member 40 is formed upon being patterned. As the material of the silicon film 41, polysilicon, for example, is used. As the material of the metal film 42, tungsten, for example, is used.

The first insulating film 21 is formed on the substrate 70 formed with the first member 40 thereon. The first insulating film 21 is planarized by performing CMP (Chemical Mechanical Polishing), using the silicon nitride film 43 as a stopper. The first insulating film 21 is partially etched using the resist pattern as a mask. By the etching, the first portion 21a, the second portion 21b and the third portion 21c are formed on the first insulating film 21. The thickness of the third portion 21c is thinner than the thickness of each of the first portion 21a and the second portion 21b. The third portion 21c is formed between the first portion 21a and the second portion 21b. The first portion 21a and the second portion 21b have substantially the same thickness. That is, the thickness d1c of the third portion 21c is thinner than the thickness d1a of the first portion 21a and the thickness d1b of the second portion 21b. The first portion 21a, the second portion 21b and the third portion 21c form the depression MG.

As the material of the first insulating film 21, silicon oxide, for example, is used. For example, a silicon oxide film (hereinafter, "TEOS film") may be used that is formed by CVD (Chemical Vapor Deposition) of raw material TEOS (Tetra Ethoxy Ortho Silicate).

The fifth insulating film 25 is formed on the first insulating film 21 and the first member 40. The upper-surface shape of the fifth insulating film 25 reflects the upper-surface shape of the first insulating film 21. The thickness d5 of the fifth insulating film 25 is thinner than the thickness d1c of the third portion 21c. A depression reflecting the depression MG is formed in the fifth insulating film 25. As the material of the fifth insulating film 25, silicon nitride, for example, is used.

The sixth insulating film 26 is formed on the fifth insulating film 25. The upper-surface shape of the sixth insulating film 26 reflects the upper-surface shape of the fifth insulating film 25. The thickness d6 of the sixth insulating film 26 is thicker than the thickness d1c of the third portion 21c. A depression reflecting the depression MG is formed in the sixth insulating film 26 through the fifth insulating film 25. As the material of the sixth insulating film 26, silicon oxide, for example, is used. For example, the TEOS film may be used.

The second insulating film 22 is formed on the sixth insulating film 26. The upper-surface shape of the second insulating film 22 reflects the upper-surface shape of the sixth insulating film 26, and the depression 22d is formed in a region directly above the third portion 21c. The thickness d2 of the second insulating film 22 is thinner than the thickness d1c of the third portion 21c. The depression 22d is the result of the transfer of the depression MG through the fifth insulating film 25 and the sixth insulating film 26. As the material of the second insulating film 22, silicon nitride, for example, is used.

Figure 4B:
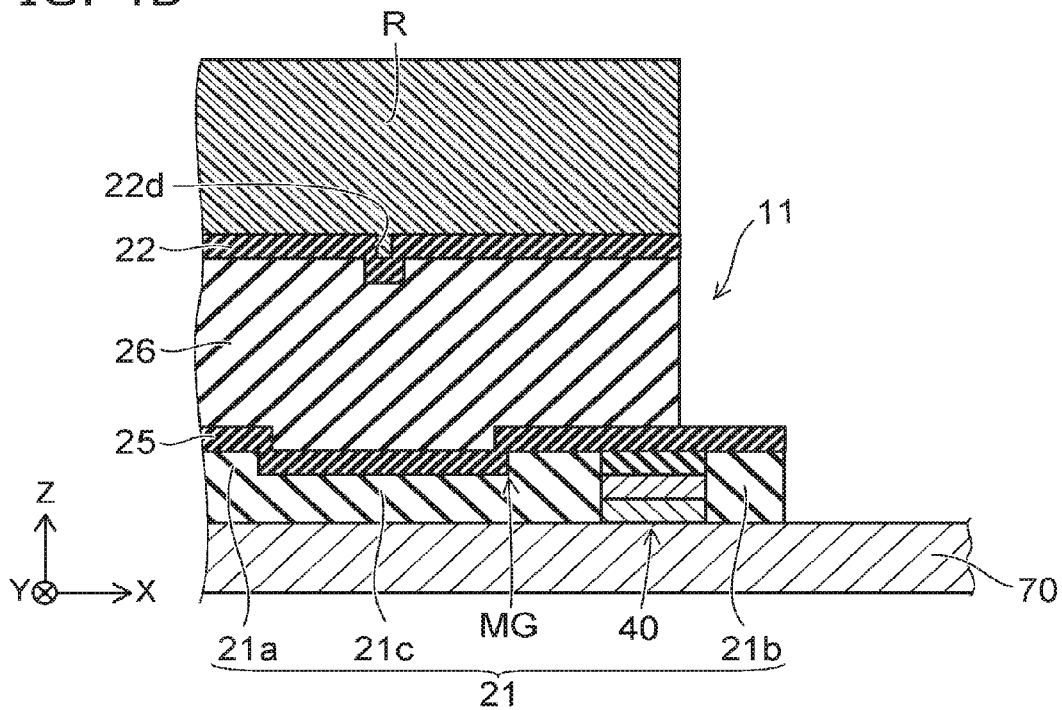
FIG. 4B is a schematic cross sectional view in the order of steps illustrating the semiconductor memory device manufacturing method according to the first embodiment.

As shown in FIG. 4B, a resist R is formed in a region including the depression 22d of the second insulating film 22. By performing an etching using the resist R as a mask, a part of the second portion 21b, a portion including a region directly above the part of the second portion 21b of the fifth insulating film 25, a portion including a region directly above the part of the second portion 21b of the sixth insulating film 26, a portion including a region directly above the part of the second portion 21b of the second insulating film 22, at least a part of a portion including a region directly above another part of the second portion 21b of the sixth insulating film 26, and at least a part of a portion including a region directly above the other part of the second portion 21b of the second insulating film 22 are removed. Thereby, at least a part of a portion including a region directly above the other part of the second portion 21b of the fifth insulating film 25, at least a part of the other part of the second portion 21b, and a part of the substrate 70 are exposed. Thereby, a first stacked body 11 is formed.

As shown in FIG. 5, the third insulating films 23 and the fourth insulating films 24 are alternately stacked on the first stacked body 11 and the part of the substrate 70. A stacked film LF including the plurality of third insulating films 23 and the plurality of fourth insulating films 24 is formed. As the material of the third insulating film 23, silicon oxide, for example, is used. As the material of the fourth insulating films 24, silicon nitride, for example, is used.

Figure 6:
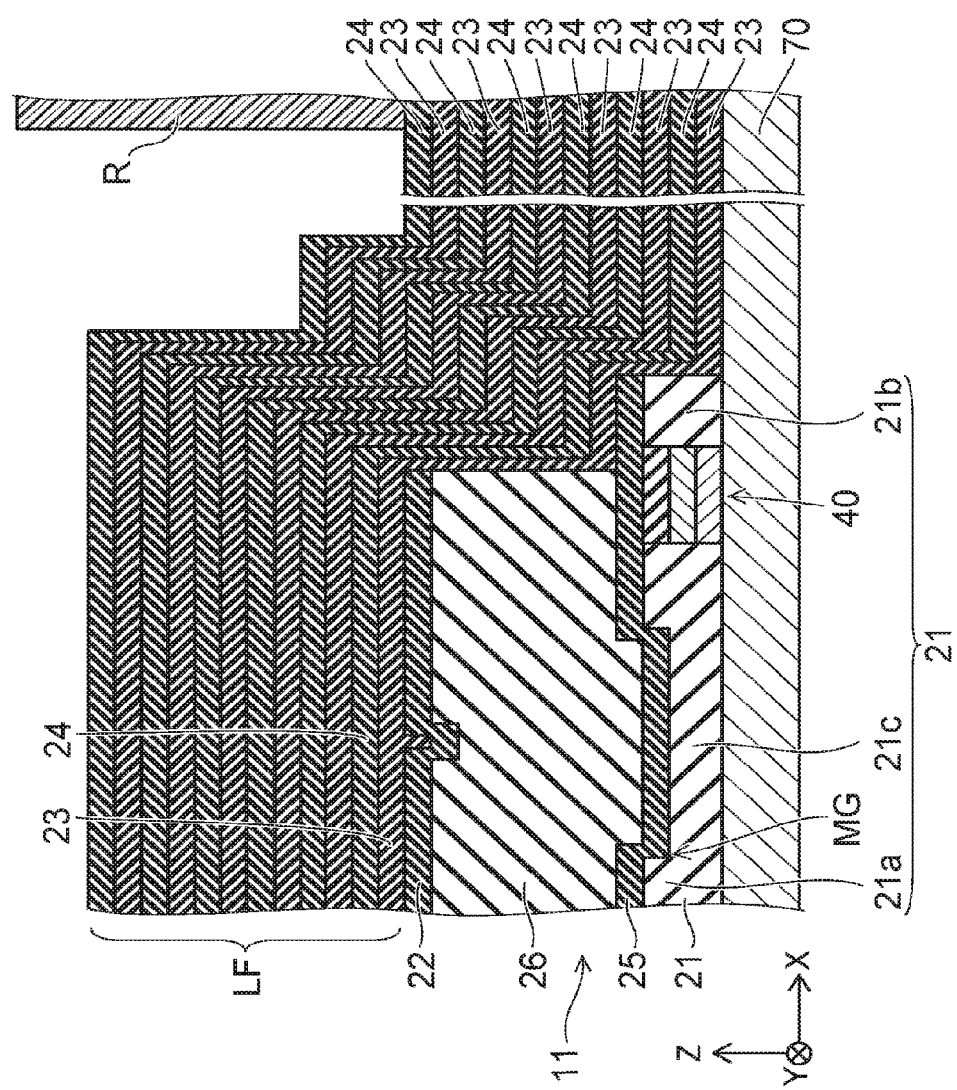
FIG. 6 is a schematic cross sectional view in the order of steps illustrating the semiconductor memory device manufacturing method according to the first embodiment.
Figure 7:
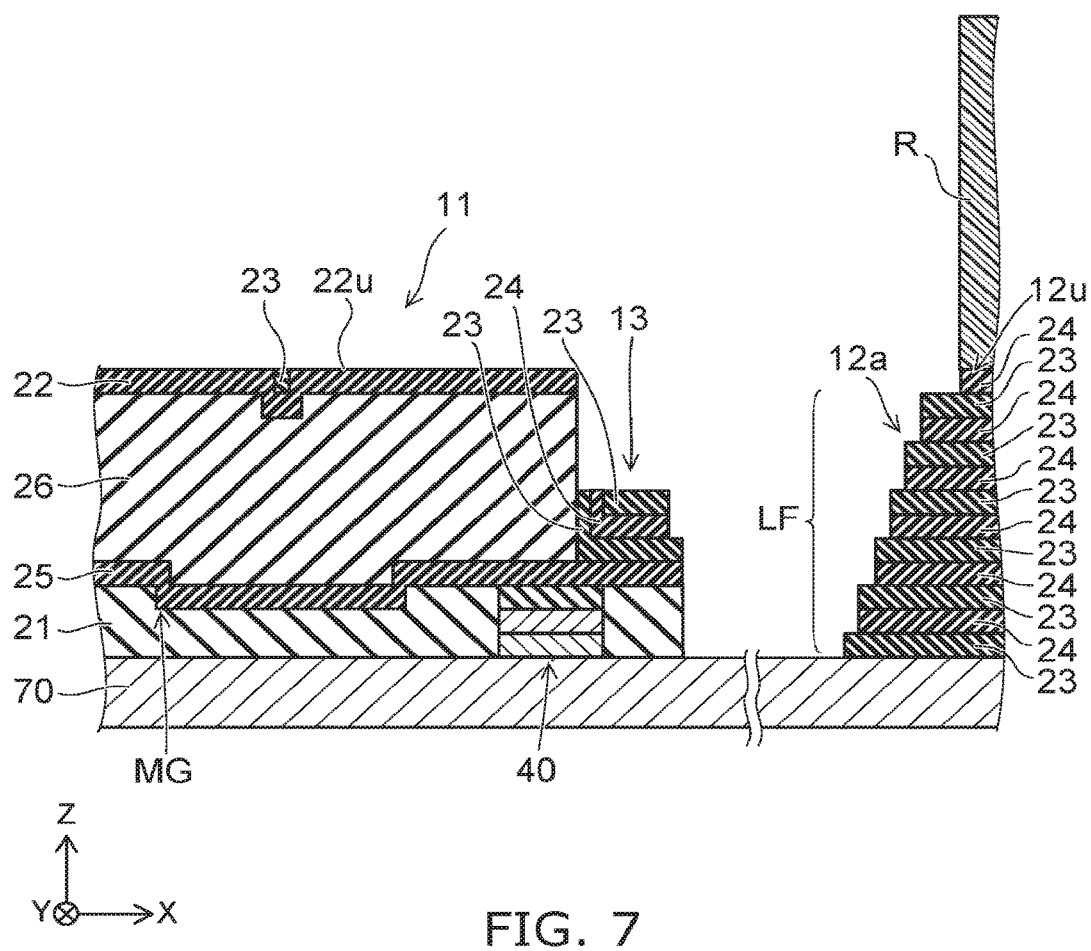
FIG. 7 is a schematic cross sectional view in the order of steps illustrating the semiconductor memory device manufacturing method according to the first embodiment.

As shown in FIG. 6 and FIG. 7, a resist R is formed in a region of the stacked film LF on the side of the memory cells. By performing an etching using the resist R as a mask, a part of the stacked film LF is removed, and the first stacked body 11 is exposed. In the state where the first stacked body 11 is exposed, the depression 22d of the second insulating film 22 is embedded with the third insulating film 23. The depression 22d is exposed by removing the third insulating film 23 using RIE (Reactive Ion Etching).

By removal of the part of the stacked film LF, the third stacked body 13 is formed between the first stacked body 11 and the remaining part of the stacked film LF. The number of layers of the third stacked body 13 is fewer than the number of layers of the remaining part of the stacked film LF. The third insulating film 23 and the fourth insulating film 24 located in the lower layer side are bent upward at the end portion of the third stacked body 13 on the side of the first stacked body 11.

As shown in FIG. 7, a stacked structure 12a is formed by processing an end portion opposing to the first stacked body of the remaining part of the stacked film LF into a stepped pattern forming steps at each of the third insulating films 23. That is, the end portions of the fourth insulating film 24 located on the third insulating films 23 is removed, and a part of the upper surfaces of the third insulating films 23 is exposed. As a result, the stacked structure 12a is formed by processing the end portion of the remaining part of the stacked film LF into the stepped pattern.

Here, the stepped pattern is formed by repeating the resist slimming process and the resist RIE process. A position of the upper surface 22u of a remaining part of the second insulating film 22 may be higher than a position of the fourth insulating film 24 at the top layer of the stacked structure 12a.

The exposing of the first stacked body 11 and the forming of the stacked structure 12a are implemented in an identical process, for example.

Figure 8:
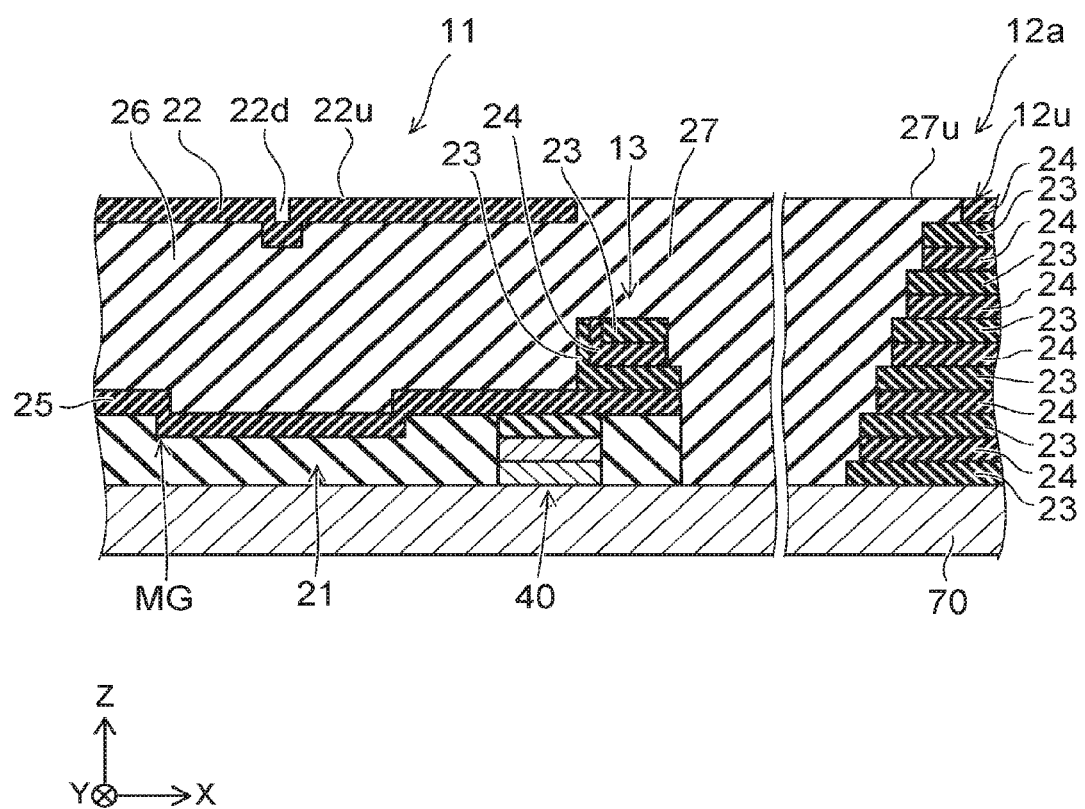
FIG. 8 is a schematic cross sectional view in the order of steps illustrating the semiconductor memory device manufacturing method according to the first embodiment.

As shown in FIG. 8, the seventh insulating film 27 is embedded in the space surrounded by the first stacked body 11, the stacked structure 12a and the third stacked body 13. As the material of the seventh insulating film 27, silicon oxide, for example, is used. For example, the TEOS film is used, as with the case of the sixth insulating film 26.

Further, the upper surface 22u of the second insulating film 22, the upper surface 12u of the stacked structure 12a and the upper surface 27u of the seventh insulating film 27 are planarized. In the planarizing process, CMP is used, for example. When the seventh insulating film 27 is formed, the seventh insulating film 27 is embedded in the depression 22d of the second insulating film 22. The second insulating film 22 includes, for example, silicon nitride. The seventh insulating film 27 includes, for example, silicon oxide. The seventh insulating film 27 embedded in the depression 22d of the second insulating film 22 can be removed under selected etching conditions, because the material of the second insulating film 22 is different from the material of the seventh insulating film 27. That is, an additional RIE process after CMP can remove the seventh insulating film 27 embedded in the depression 22d, and the depression 22d is exposed. There are cases where CMP only can remove the seventh insulating film 27 embedded in the depression 22d, without performing the RIE process.

The second stacked body 12 is formed by replacing the fourth insulating film 24 of the stacked structure 12a with electrode film WL. As the material of the electrode film WL, a metal such as tungsten, for example, is used. In the replacing method, for example, a slit (not illustrated) is formed through the stacked structure 12a along Z-direction, and the fourth insulating film 24 is removed through the slit. For example, wet etching by phosphoric acid ($H_3PO_4$) may be used to remove the fourth insulating film 24.

An electrode material, for example, such as tungsten is deposited through the slit, the electrode material is embedded in the spaces from which the fourth insulating film 24 has been removed. By removing the electrode material deposited in the slit, the electrode material is isolated in each of the spaces from which the fourth insulating film 24 has been removed. As a result, the electrode film WL is formed between two third insulating films 23. In this manner, only the fourth insulating film 24 can be removed, and replaced with the electrode film WL.

The semiconductor wafer 1 according to the first embodiment can be obtained in the manner described above. Thereafter, the semiconductor wafer 1 is divided into individual semiconductor memory devices using a dicing blade 80 in FIG. 9A or a laser 90 in FIG. 9B.

FIGS. 10A, 10B, 11A and 11B are schematic cross sectional views in the order of steps illustrating a semiconductor wafer manufacturing method according to reference examples.

The manufacturing method according to reference examples is a method for manufacturing the semiconductor wafer 199 of FIG. 3A.

Figure 10A:
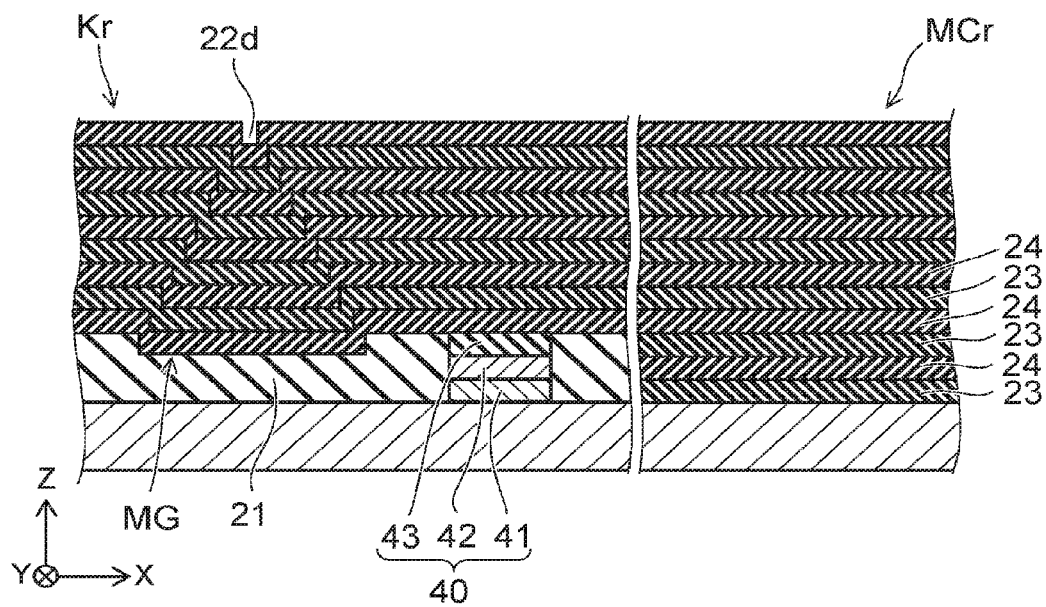
FIG. 10A is a schematic cross sectional view in the order of steps illustrating the semiconductor wafer manufacturing method according to the reference example.

As shown in FIG. 10A, the first member 40 is formed on a part of the substrate 70. Specifically, the silicon film 41 is formed on the substrate 70, the metal film 42 is formed on the silicon film 41, and the silicon nitride film 43 is formed on the metal film 42. The first member 40 is formed upon being patterned.

The first insulating film 21 is formed on the substrate 70 formed with the first member 40. The first insulating film 21 is planarized by performing CMP, using the silicon nitride film 43 as a stopper. The first insulating film 21 is partially etched using the resist pattern as a mask. Thus, the depression MG is formed in the first insulating film 21. The first insulating film 21 on the side of the memory cell region MCr is removed, and the substrate 70 is exposed.

The third insulating films 23 and the fourth insulating films 24 are alternately formed on the first insulating film 21, the first member 40 and the substrate 70. As a result, the depression 22*d* reflecting the depression MG is formed in the top layer of the fourth insulating film 24.

Figure 10B:
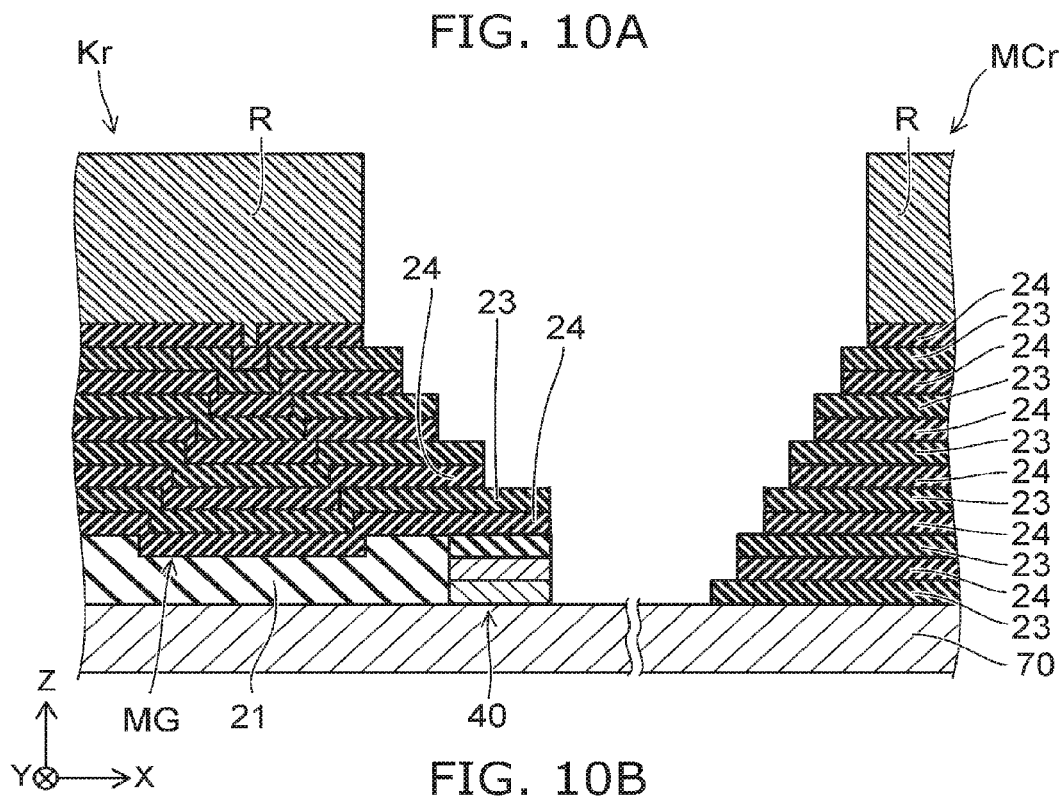
FIG. 10B is a schematic cross sectional view in the order of steps illustrating the semiconductor wafer manufacturing method according to the reference example.

As shown in FIG. 10B, a resist R is formed on the top layer of the fourth insulating film 24, and a stepped structure is formed in the kerf region Kr and the memory cell region MCr by repeating the resist R slimming process and the resist R RIE process.

Figure 11A:
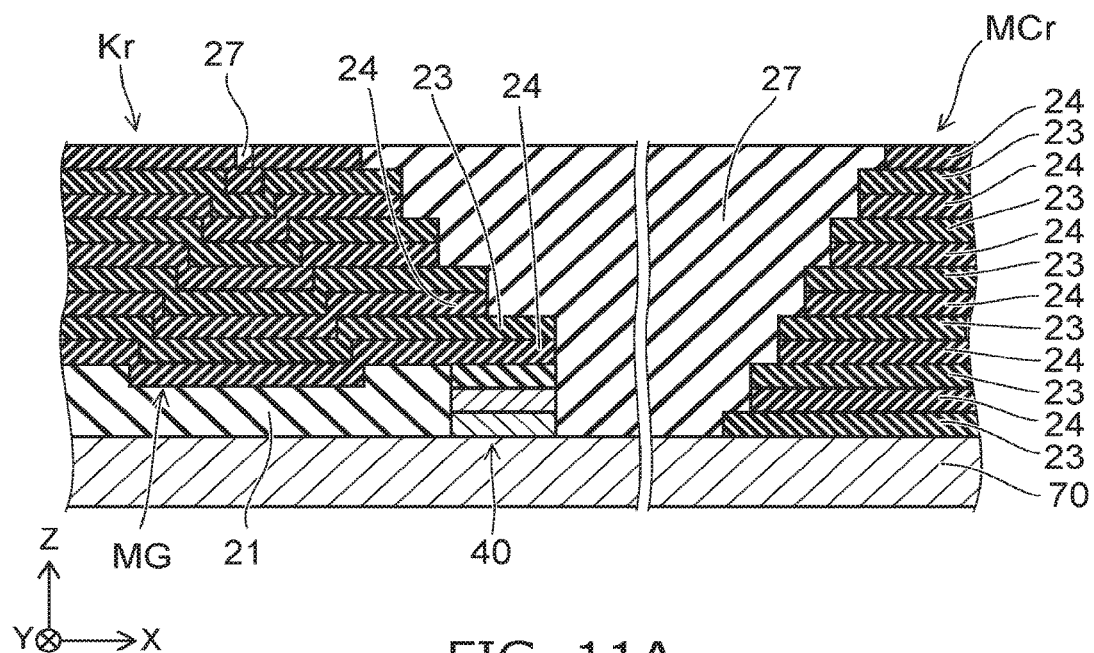
FIG. 11A is a schematic cross sectional view in the order of steps illustrating the semiconductor wafer manufacturing method according to the reference example.

As shown in FIG. 11A, the resist R is removed, and the seventh insulating film 27 is formed on the top layer of the fourth insulating film 24 and the stepped structure. The seventh insulating film 27 is then removed by etching, and the top layer of the fourth insulating film 24 is exposed. In this state, the seventh insulating film 27 is embedded in the depression 22*d*.

Figure 11B:
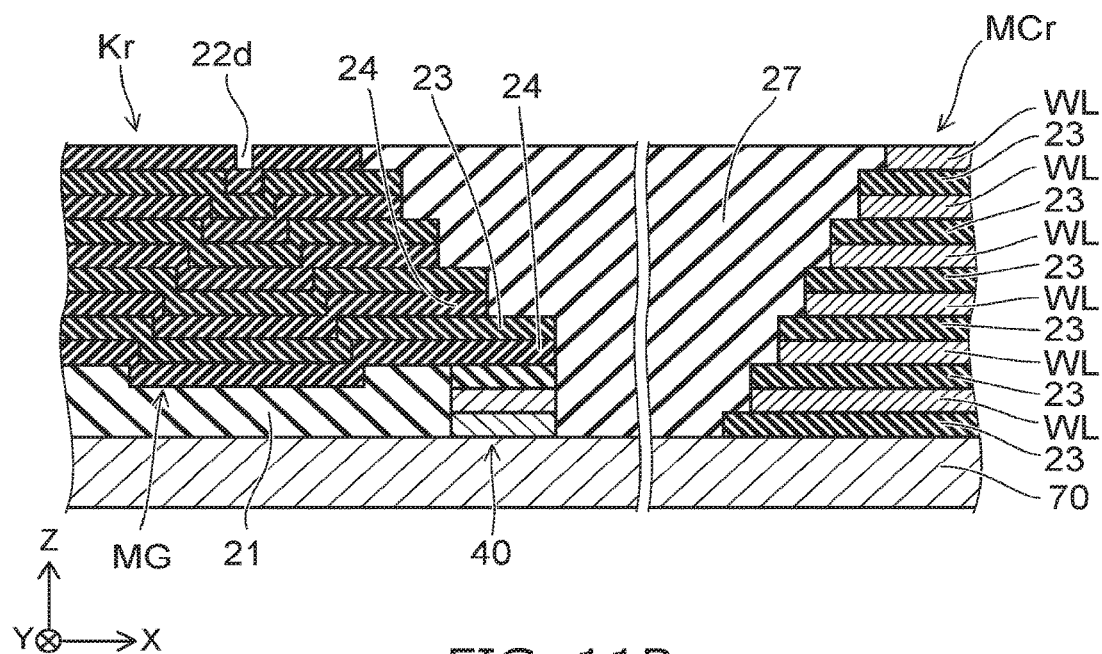
FIG. 11B is a schematic cross sectional view in the order of steps illustrating the semiconductor wafer manufacturing method according to the reference example.

As shown in FIG. 11B, the seventh insulating film 27 embedded in the depression 22*d* is removed, and the depression 22*d* is exposed. The fourth insulating film 24 on the side of the memory cell region MCr is replaced with electrode film WL. Thus, the semiconductor wafer 199 of FIG. 3A is acquired.

According to the manufacturing method of the reference example, the depression 22*d* is formed. However, as shown in FIG. 11B, the stepped structure occurs in both the stacked body on the side of the kerf region Kr and the stacked body on the side of the memory cell region MCr. As a result, the distance between the stacked bodies increases. On the other hand, according to the manufacturing method of the embodiment, the depression 22*d* is formed, and further the stepped structure does not occur in the stacked body on the side of the kerf region Kr. Thus, the distance between the stacked bodies in the embodiment can be made shorter than that in the reference example. This makes it possible to reduce the chip size while maintaining the depression 22*d*.

As described above with reference to FIG. 3B, it might be possible to remove the stepped structure on the side of the kerf region Kr. However, the depression 22*d* corresponding to the depression MG is also removed by removing the stepped structure, and it is difficult to align.

On the other hand, in the embodiment, the depression MG of the first insulating film 21 is transferred in Z-direction through the fifth insulating film 25 and the sixth insulating film 26, and the depression 22*d* is formed in the upper surface 22*u* of the second insulating film 22. Unlike the reference example of FIG. 3A, there is no stepped structure on the side of the kerf region Kr. Unlike the reference example of FIG. 3B, the depression 22*d* is formed on the side of the kerf region Kr.

That is, in the embodiment, the distance between the first stacked body 11 and the second stacked body 12 can be reduced while maintaining the depression 22*d* corresponding to the depression MG.

Second Embodiment

Figure 12A:
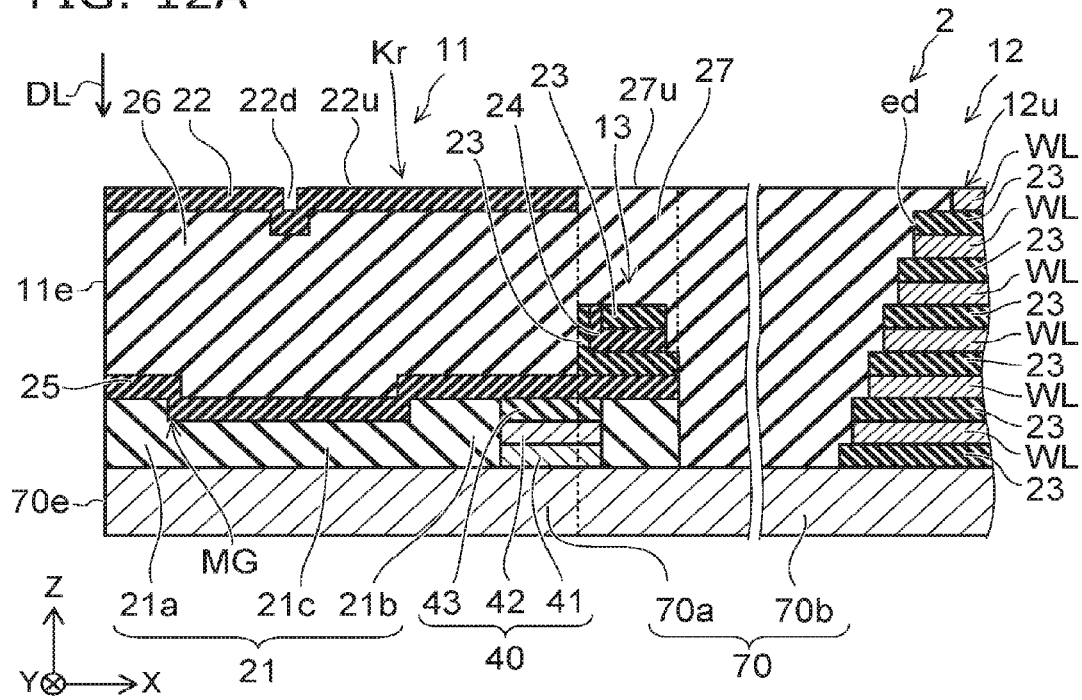
FIG. 12A is a schematic cross sectional view illustrating a semiconductor memory device according to a second embodiment.
Figure 12B:
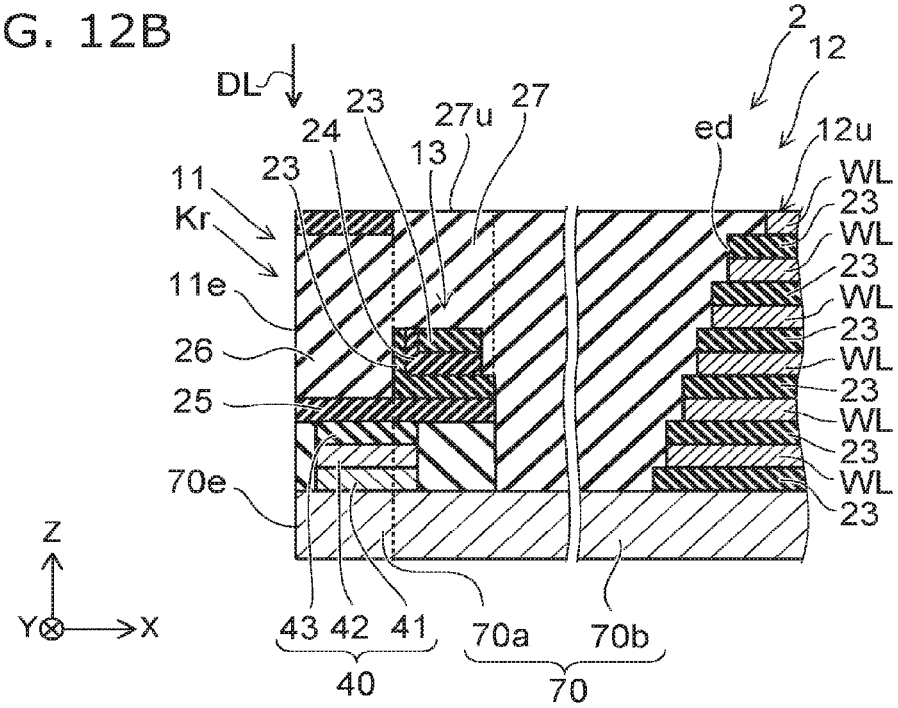
FIG. 12B is a schematic cross sectional view illustrating the semiconductor memory device according to the second embodiment.

FIGS. 12A and 12B are schematic cross sectional views illustrating a semiconductor memory device according to a second embodiment.

A semiconductor memory device 2 according to the embodiment is obtained by cutting the semiconductor wafer 1 at dicing lines DL. In the embodiment, an side surface 11*e* of the first stacked body 11 on an opposite side of the second stacked body 12 and an side surface 70*e* of the substrate 70 are located on the same surface. The side surface 11*e* and the side surface 70*e* are the cut surfaces in the dicing of the semiconductor wafer 1 at dicing lines DL. Other configurations are the same as in the semiconductor wafer 1.

In the semiconductor memory device 2 according to the embodiment, as shown in FIG. 12A, the depression MG of the first insulating film 21 is transferred in Z-direction through the fifth insulating film 25 and the sixth insulating film 26, and the depression 22*d* is formed in the upper surface 22*u* of the second insulating film 22. There is no stepped structure in the first stacked body 11 on the side of the kerf region Kr. Thus, the distance between the stacked bodies can be made shorter while maintaining the depression 22*d* corresponding to the depression MG. This makes it possible to reduce the chip size.

Depending on the way of cutting the semiconductor wafer 1, the semiconductor memory device 2 may not include the depression 22*d*, as shown in FIG. 12B.

Figure 13:
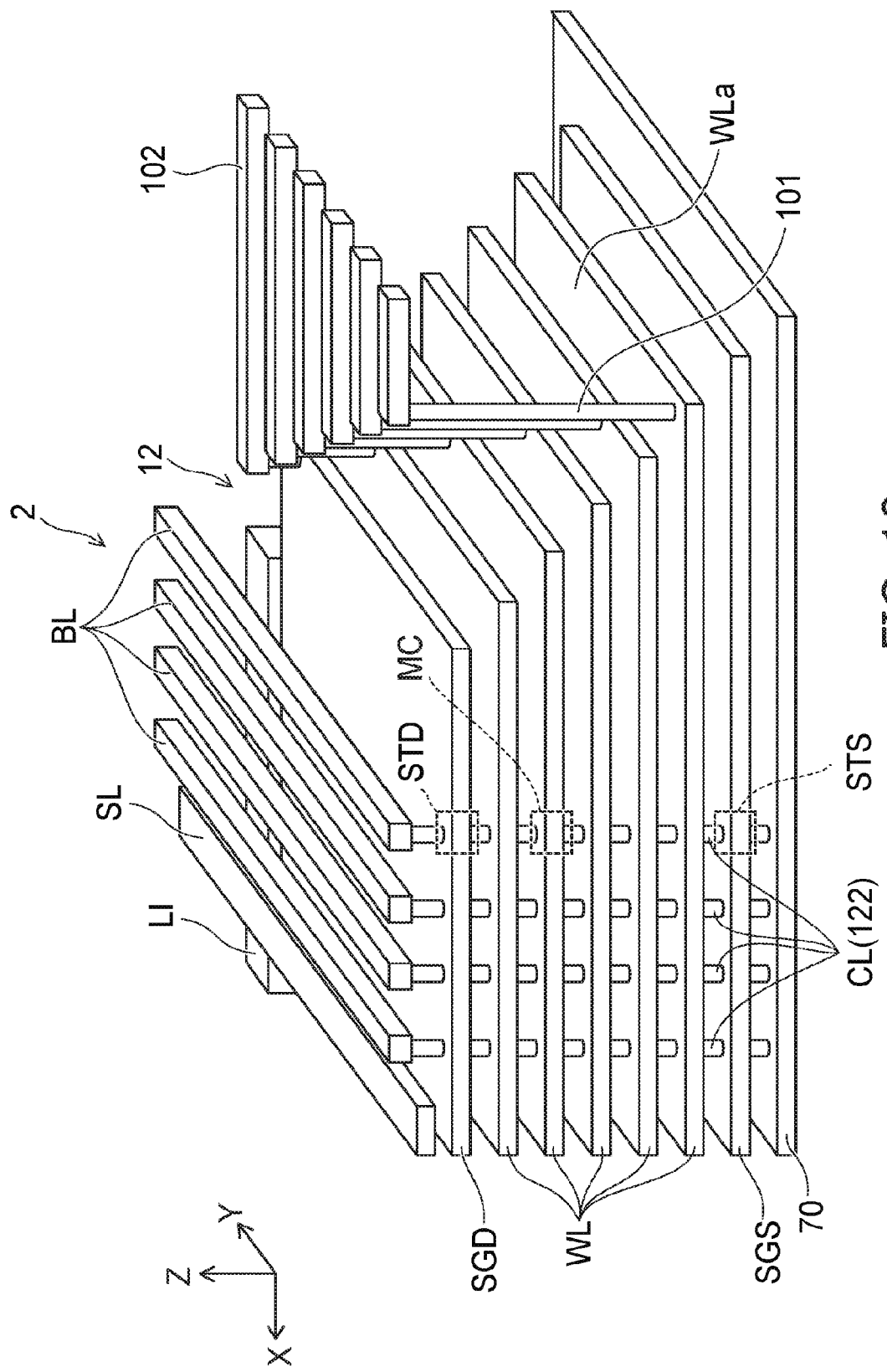
FIG. 13 is a schematic perspective view illustrating the semiconductor memory device according to the second embodiment.

FIG. 13 is a schematic perspective view illustrating the semiconductor memory device according to the second embodiment.

FIG. 13 illustrates a region around the stepped structure of the second stacked body 12.

For easier viewing of the drawing, FIG. 13 does not show elements such as the first stacked body 11, the third stacked body 13, and the insulating films between the electrode films.

In the example, the diagram shows the structure at the end portion of the memory cell portion along X-direction. The structure is the same for Y-direction.

As shown in FIG. 13, the semiconductor memory device 2 includes a substrate 70, a plurality of electrode films WL stacked on the substrate 70 in Z-direction, and memory columnar bodies CL that extend through the plurality of electrode films WL in Z-direction. The intersections of the electrode films WL and the memory columnar bodies CL function as memory cells MC. The intersections of a source-side select gate electrode SGS and the memory columnar bodies CL function as source-side select gate transistors STS. The intersections of a drain-side select gate electrode SGD and the memory columnar bodies CL function as drain-side select gate transistors STD.

As the material of the electrode film WL, such as tungsten and polysilicon, for example, are used. The electrode film WL functions as a word line. As the materials of the drain-side select gate electrode SGD and the source-side select gate electrode SGS, such as tungsten and polysilicon, for example, are used.

An end portion of the plurality of electrode films WL is formed in a stepped pattern. The stepped structure corresponds to the stepped structure of the second stacked body 12. The electrode film WL has a contact portion WLa that does not face the lower surface of another electrode film WL located on upper side of the electrode film WL. The electrode film WL is connected to a through contact wire 101 at the contact portion WLa. A wire 102 is provided at the upper end of each through contact wire 101. The wire 102 is connected to components such as peripheral circuits not illustrated. As the materials of the through contact wire 101 and the wire 102, tungsten, for example, is used.

The semiconductor memory device 2 includes a source contact LI, a plurality of bit lines BL, and a source layer SL.

The source contact LI faces a side surface in Y-direction of the plurality of electrode films WL, and extends in X-direction. The lower surface of the source contact LI contacts the substrate 70. As the material of the source contact LI, tungsten, for example, is used.

The plurality of bit lines BL is located above the drain-side select gate electrode SGD. The bit lines BL extend in Y-direction, and are arranged in X-direction. The lower surface of the bit line BL is connected to the memory columnar bodies CL. As the material of the bit line BL, tungsten, for example, is used.

The source layer SL is located above the drain-side select gate electrode SGD, and extends in Y-direction. The lower surface of the source layer SL is connected to the source contact LI. As the material of the source layer SL, tungsten, for example, is used.

Figure 14:
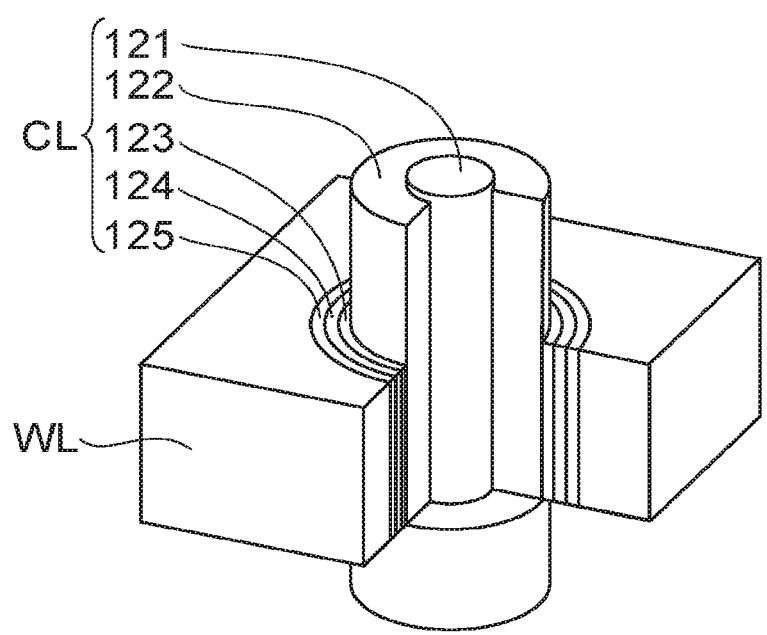
FIG. 14 is a schematic view illustrating a part of the semiconductor memory device according to the second embodiment.

FIG. 14 is a schematic view illustrating a part of the semiconductor memory device according to the second embodiment.

FIG. 14 illustrates the memory cell structure.

As shown in FIG. 14, the memory cell MC is formed at the intersection of the electrode film WL and the memory columnar body CL. The memory columnar body CL includes a core insulator 121 extending in Z-direction, a semiconductor film 122 provided along a side wall surface of the core insulator 121, a tunnel insulating film 123, a charge storage film 124, and a block insulating film 125. A memory film is configured by the tunnel insulating film 123, the charge storage film 124, and the block insulating film 125. The tunnel insulating film 123, the charge storage film 124 and the block insulating film 125 are provided between the semiconductor film 122 and the electrode film WL.

As the material of the core insulator 121, silicon oxide, for example, is used. As the material of the semiconductor film 122, polysilicon, for example, is used. The semiconductor film 122 functions as a channel of the memory cell MC. As the material of the tunnel insulating film 123, silicon oxide, for example, is used. As the material of the charge storage film 124, silicon nitride, for example, is used. As the material of the block insulating film 125, silicon oxide, for example, is used. A floating gate may be used in place of the charge storage film 124. For example, it may be used as a structure embedded a floating gate inside space formed by boring the plurality of electrode films WL.

Figure 15:
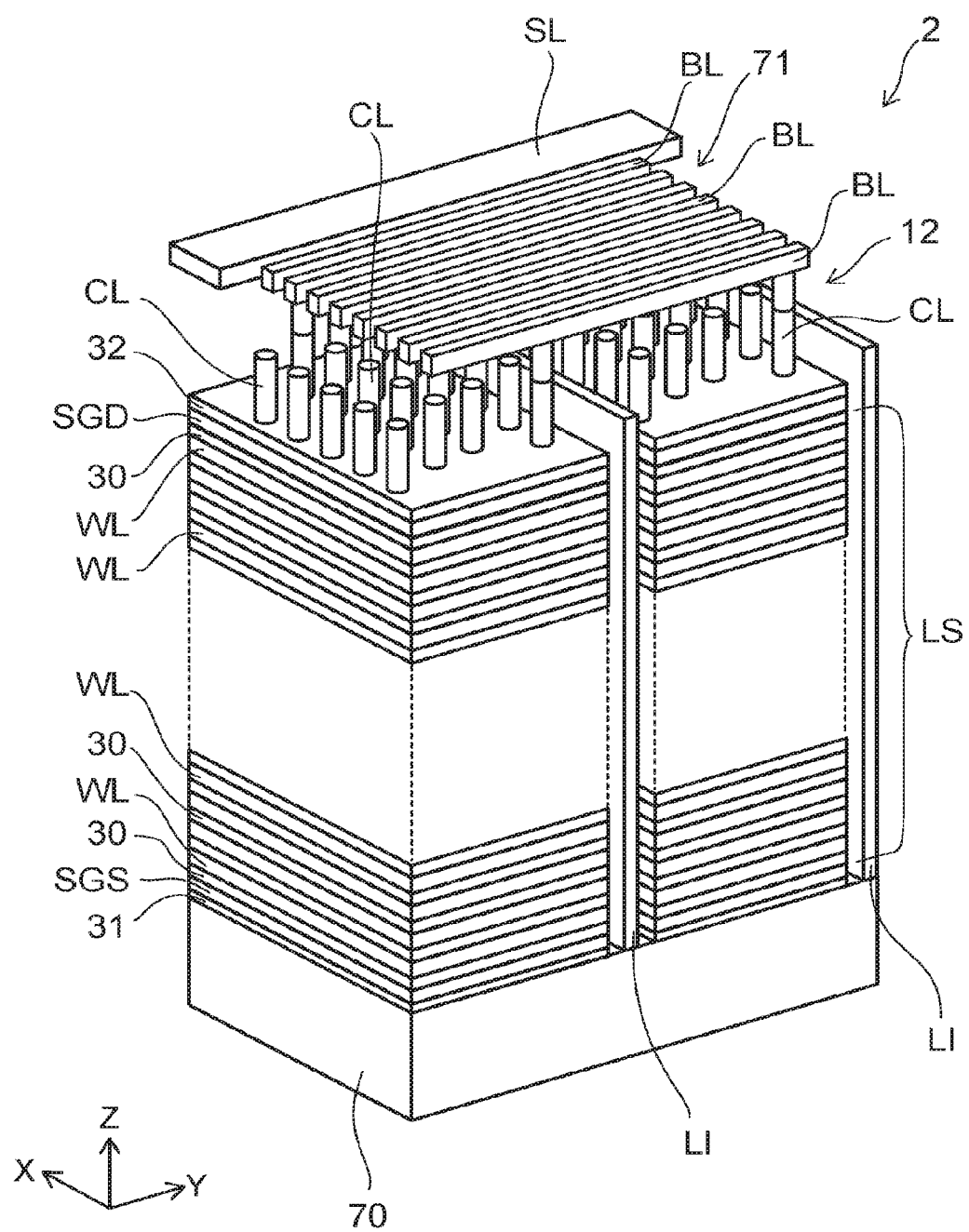
FIG. 15 is a schematic perspective view illustrating the semiconductor memory device according to the second embodiment.

FIG. 15 is a schematic perspective view illustrating the semiconductor memory device according to the second embodiment.

FIG. 15 schematically illustrates a structure around the second stacked body 12. For easier viewing of the drawing, elements such as the insulating films between the electrode films are not illustrated.

The semiconductor memory device 2 includes a substrate 70, a stacked body LS, a source-side select gate electrode SGS, a drain-side select gate electrode SGD, a plurality of memory columnar bodies CL, an interconnection layer 71, an insulating film 31, and an insulating film 32.

In the example, X-direction and Y-direction are directions that are perpendicular to each other, and parallel to the major surface of the substrate 70. Z-direction (stacked direction) is a direction perpendicular to both X-direction and Y-direction.

The interconnection layer 71 includes a plurality of bit lines BL, and a source layer SL. The interconnection layer 71 is provided separately from the substrate 70 in Z-direction. The bit lines BL extend in Y-direction, and are arranged in X-direction.

The stacked body LS is disposed between the substrate 70 and the interconnection layer 71. The insulating film 31 is provided on the substrate 70. The insulating film 32 is provided below the interconnection layer 71. The source-side select gate electrode SGS is disposed between the stacked body LS and the insulating film 31. The drain-side select gate electrode SGD is disposed between the stacked body LS and the insulating film 32.

The stacked body LS includes a plurality of electrode films WL and a plurality of insulating films 30. In the stacked body LS, the insulating film 30 is provided between two electrode films WL. That is, the plurality of electrode films WL and the plurality of insulating films 30 are alternately stacked. The number of layers of stacked electrode film WL shown in FIG. 15 is given as an example, and any number of layers of electrode film WL may be provided. The electrode film WL functions as word line.

As the material of the electrode film WL, metal, for example, is used. The electrode film WL includes at least one of, for example, tungsten, molybdenum, titanium nitride, and tungsten nitride. The electrode film WL may include silicon or metal silicide. The source-side select gate electrode SGS and the drain-side select gate electrode SGD are used the same material used for the electrode film WL, for example. As the materials of the plurality of insulating films 30, the insulating film 31 and the insulating film 32, silicon oxide, for example, are used.

In the stacked body LS, a plurality of memory columnar bodies CL extending in Z-direction are disposed. A shape of the memory columnar body CL is a circular or an ellipsoidal column, for example. The plurality of memory columnar bodies CL is disposed in a staggered, for example. The plurality of memory columnar bodies CL may be disposed in a square pattern along X-direction and Y-direction. The memory columnar body CL is electrically connected to the substrate 70.

In the stacked body LS, interlayer interconnection layer LI that extend in X-direction and Z-direction inside the stacked body LS is disposed. The lower end of the interlayer interconnection layer LI is disposed in the substrate 70. The interlayer interconnection layer LI is electrically connected to each of the semiconductor films (semiconductor pillars) 122 in the memory columnar body CL through the substrate 70. The upper end of the interlayer interconnection layers LI is electrically connected to a peripheral circuit through the contact portion.

The plurality of bit lines BL is disposed above the stacked body LS. The plurality of bit lines BL is arranged in X-direction, separately from each other. The plurality of bit lines BL extends in Y-direction. Each of the plurality of bit lines BL is electrically connected to the upper end of each of the plurality of semiconductor films 122.

In the plurality of memory columnar bodies CL, each one of the plurality of semiconductor films 122 selected from each region separated in Y-direction through the interlayer interconnection layer LI is connected to a single common bit line BL.

Third Embodiment

Figure 16:
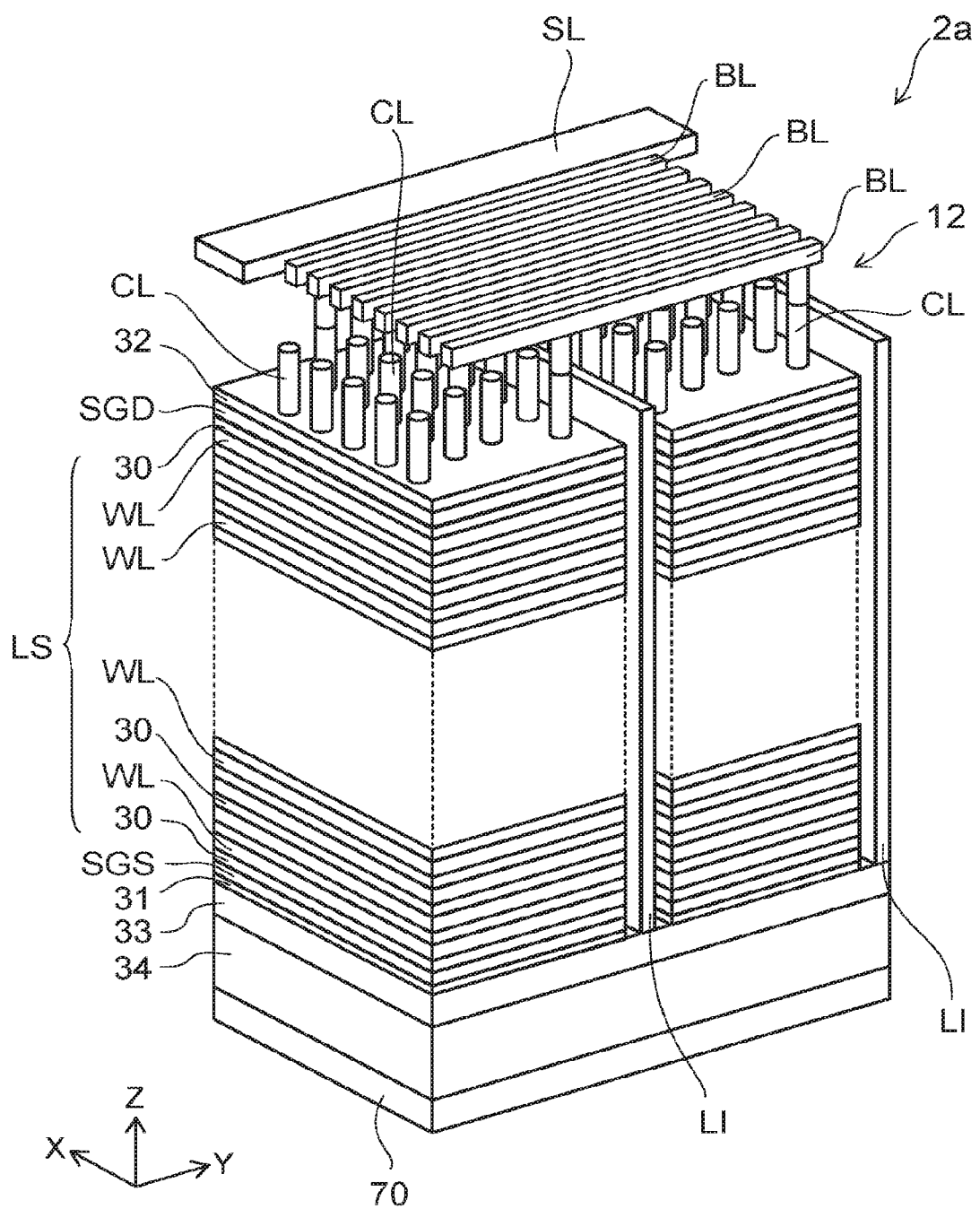
FIG. 16 is a schematic perspective view illustrating a semiconductor memory device according to a third embodiment.

The semiconductor memory device 2 according to the second embodiment may have the structure shown in FIG. 16, instead of the structure shown in FIG. 15.

FIG. 16 is a schematic perspective view illustrating a semiconductor memory device according to a third embodiment.

A semiconductor memory device 2a further includes, for example, a conductive film 33 and an insulating film 34, in comparison with the semiconductor memory device 2. The insulating film 34 is provided on the substrate 70. An interconnection layer and circuit elements such as transistors not illustrated are provided in the insulating film 34. The conductive film 33 is provided on the insulating film 34. The insulating film 31 is provided on the conductive film 33. The configuration above the insulating film 31 is the same as the configuration of the semiconductor memory device 2, for example.

The lower end of the interlayer interconnection layers LI is electrically connected to the semiconductor film 122 in the memory columnar body CL through the conductive film 33.

Fourth Embodiment

Figure 17:
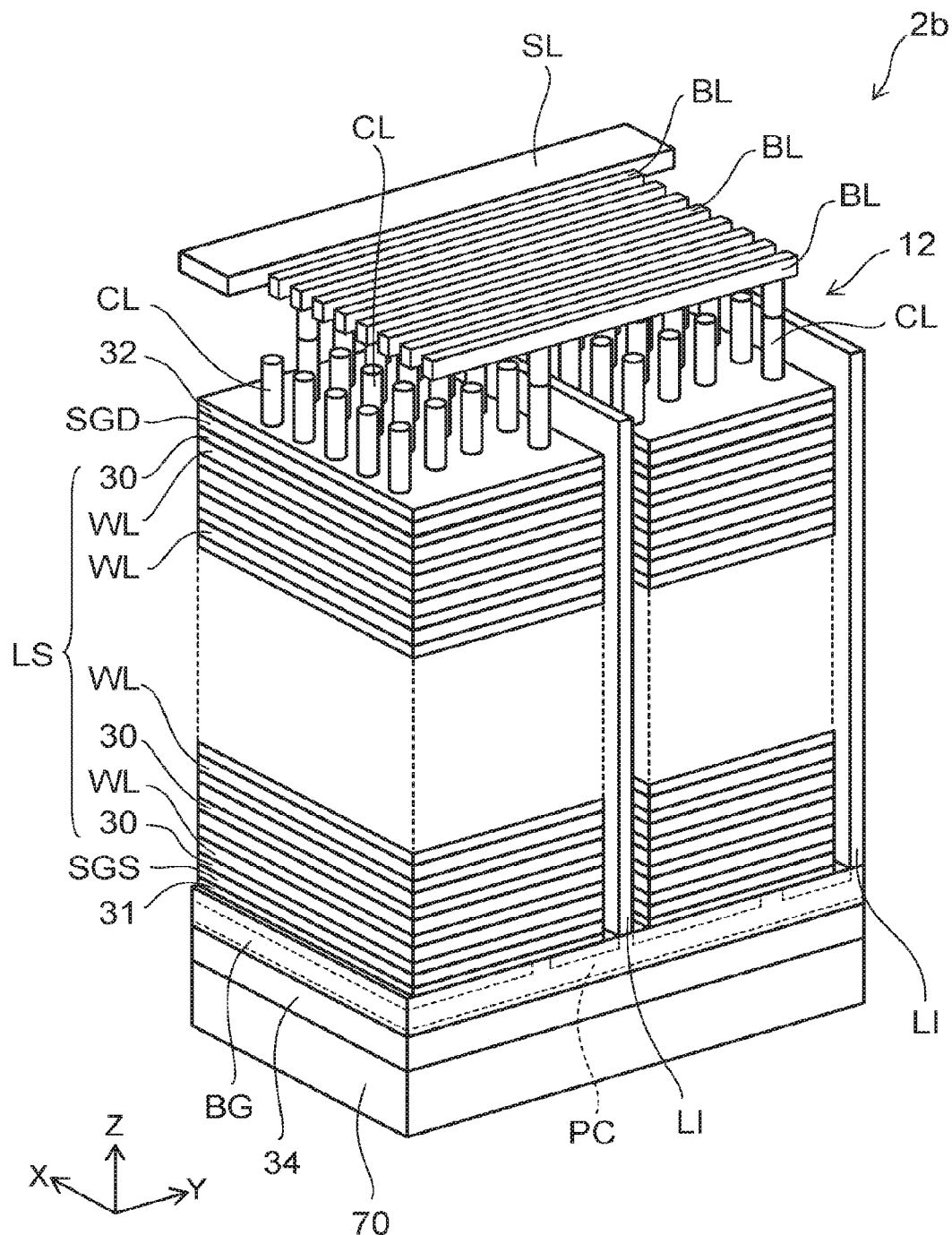
FIG. 17 is a schematic perspective view illustrating a semiconductor memory device according to a fourth embodiment.

FIG. 17 is a schematic perspective view illustrating a semiconductor memory device according to a fourth embodiment.

As shown in FIG. 17, a semiconductor memory device 2b includes a substrate 70, a back gate BG (conductive layer), a stacked body LS, a plurality of memory columnar bodies CL, interlayer interconnection layers LI, and an upper layer wire. The upper layer wire includes bit lines BL and a source layer SL.

The back gate BG is provided on the substrate 70 through the insulating film 34. A source-side select gate electrode SGS is provided on the back gate BG through the insulating film 31. The stacked body LS is provided on the source-side select gate electrode SGS. The stacked body LS includes a plurality of conductive films WL and a plurality of insulating films 30.

A drain-side select gate electrode SGD is provided on the stacked body LS. An insulating film 32 is provided on the drain-side select gate electrode SGD.

The memory columnar body CL includes, for example, the semiconductor film 122 and the memory film (the tunnel insulating film 123, the charge storage film 124 and the block insulating film 125), as in the second embodiment. The plurality of memory columnar bodies CL is arranged along X-direction and Y-direction.

The interlayer interconnection layer LI extends in X-direction and Y-direction between the adjacent stacked bodies LS. The lower surface of the interlayer interconnection layer LI is electrically connected to the memory columnar body CL through a junction member PC provided in the back gate BG. The upper end of the interlayer interconnection layer LI is connected to the source layer SL provided above the stacked body LS.

The junction member PC is integrated with the memory columnar body CL, and extends in X-direction and Y-direction inside the back gate BG. The memory columnar body CL is integrated with the junction member PC, for example. As used herein, "integrated with" means that a part of the material used for the memory columnar body CL extends to the junction member PC. Accordingly, a part of the junction member PC includes the memory film (the tunnel insulating film 123, the charge storage film 124 and the block insulating film 125), and the semiconductor film 122.

The plurality of bit lines BL is provided on the stacked body LS. The plurality of bit lines BL is separated from each other in X-direction, and extends in Y-direction. The upper end portion of the semiconductor film 122 is connected to the bit line BL through the contact portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor wafer comprising:
   a substrate;
   a first stacked body being provided on a part of the substrate; and
   a second stacked body being provided on another part of the substrate, the second stacked body being provided separately from the first stacked body in a first direction,
   the first stacked body including:
      a first insulating film being provided on the part of the substrate, the first insulating film including a first portion, a second portion, and a third portion, the second portion being arranged with the first portion in the first direction, the third portion being provided between the first portion and the second portion, a thickness of each of the first portion and the second portion being thicker than a thickness of the third portion; and
      a second insulating film being provided on the first portion, the third portion, and at least a part of the second portion, the second insulating film including an upper surface, the upper surface having a depression overlapping the third portion when projected over a plane including the first direction and a second direction intersecting the first direction,
   the second stacked body including a plurality of third insulating films and a plurality of electrode films, the third insulating films and the electrode films being alternately stacked,
   a shape of an end portion of the second stacked body on a side opposing to the first stacked body being a stepped pattern.

2. The semiconductor wafer according to claim 1, wherein the first stacked body is provided in a kerf region, and the second stacked body is provided in a memory cell region.

3. The semiconductor wafer according to claim 1, further comprising a third stacked body being provided between the first stacked body and the second stacked body, the third insulating films and fourth insulating films being alternately stacked in the third stacked body, wherein
   the first stacked body further includes:
      a fifth insulating film being provided between the first insulating film and the second insulating film, the fifth insulating film overlapping the first insulating film; and
      a sixth insulating film being provided between the fifth insulating film and the second insulating film, a thickness of the sixth insulating film is thicker than the thickness of the third portion,
   a position of the third stacked body is higher than a position of the fifth insulating film, and is lower than a position of an upper surface of the second stacked body.

4. The semiconductor wafer according to claim 3, wherein a number of layers of the third stacked body is fewer than a number of layers of the second stacked body, at an end portion of the third stacked body on a side of the first stacked body, the third insulating film and the fourth insulating film located in a lower layer side are bent upward.

5. The semiconductor wafer according to claim 3, further comprising a seventh insulating film being provided between the first stacked body, the second stacked body, and the third stacked body,
   wherein a position of an upper surface of the seventh insulating film and a position of the upper surface of the second insulating film are substantially at a same height.

6. The semiconductor wafer according to claim 3, further comprising a first member being provided between the substrate and the fifth insulating film, the second portion being provided between the third portion and the first member, wherein
   the first member includes:
     a silicon film being provided on the substrate;
     a metal film being provided on the silicon film; and
     a silicon nitride film being provided on the metal film.

7. The semiconductor wafer according to claim 1, wherein a position of an upper surface of the second stacked body and a position of the upper surface of the second insulating film are substantially at a same height.

8. A semiconductor memory device comprising:
a substrate;
a first stacked body being provided on a part of the substrate; and
a second stacked body being provided on another part of the substrate by being provided separately from the first stacked body in a first direction,
the first stacked body including:
   a first insulating film being provided on the part of the substrate, the first insulating film including a first portion, a second portion, and a third portion, the second portion being arranged with the first portion in the first direction, the third portion being provided between the first portion and the second portion, a thickness of each of the first portion and the second portion being thicker than a thickness of the third portion; and
   a second insulating film being provided on the first portion, the third portion, and at least a part of the second portion, the second insulating film including an upper surface, the upper surface having a depression overlapping the third portion when projected over a plane including the first direction and a second direction intersecting the first direction,
the second stacked body including a plurality of third insulating films and a plurality of electrode films, the third insulating films and the electrode films being alternately stacked,
a shape of an end portion of the second stacked body on a side opposing to the first stacked body being a stepped pattern,
a side surface of the first stacked body on an opposite side of the second stacked body and a side surface of the substrate locating on a same surface.

* * * * *